(12) United States Patent
Park et al.

(10) Patent No.: US 12,174,490 B2
(45) Date of Patent: Dec. 24, 2024

(54) LIGHT PATH CONTROL MEMBER AND DISPLAY DEVICE COMPRISING SAME

(71) Applicant: LG INNOTEK CO., LTD., Seoul (KR)

(72) Inventors: Jin Gyeong Park, Seoul (KR); Jun Lee, Seoul (KR); Byung Sook Kim, Seoul (KR); Mun Yeong Son, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/007,377

(22) PCT Filed: Jul. 27, 2021

(86) PCT No.: PCT/KR2021/009679
§ 371 (c)(1),
(2) Date: Jan. 30, 2023

(87) PCT Pub. No.: WO2022/025578
PCT Pub. Date: Feb. 3, 2022

(65) Prior Publication Data
US 2023/0273480 A1  Aug. 31, 2023

(30) Foreign Application Priority Data

Jul. 28, 2020  (KR) .................... 10-2020-0093885
Jul. 28, 2020  (KR) .................... 10-2020-0093972

(51) Int. Cl.
*G02F 1/1333* (2006.01)
*G02F 1/1335* (2006.01)
(Continued)

(52) U.S. Cl.
CPC .... *G02F 1/133614* (2021.01); *G02F 1/13338* (2013.01); *G02F 1/133603* (2013.01); *G02F 1/134309* (2013.01)

(58) Field of Classification Search
CPC .......... G02F 1/133614; G02F 1/13338; G02F 1/133603; G02F 1/134309; G02F 1/1323;
(Continued)

(56) References Cited

U.S. PATENT DOCUMENTS 8,611,000 B2  12/2013  Komatsu et al.
8,791,896 B2   7/2014  Kwon et al.
(Continued)

FOREIGN PATENT DOCUMENTS

CN  102402093 A  4/2012
CN  102540617 A  7/2012
(Continued)

OTHER PUBLICATIONS

International Search Report dated Nov. 9, 2021 in International Application No. PCT/KR2021/009679.
(Continued)

*Primary Examiner* — Thoi V Duong
(74) *Attorney, Agent, or Firm* — Saliwanchik, Lloyd & Eisenschenk

(57) ABSTRACT

A light path control member according to an embodiment comprises: a first substrate; a first electrode disposed on the first substrate; a second substrate disposed on the first substrate; a second electrode disposed under the second substrate; and a light conversion part disposed between the first electrode and the second electrode, wherein: the light conversion part includes a plurality of partition wall portions and a plurality of receiving portions which are alternately arranged; a light conversion material comprising a dispersion and multiple light conversion particles dispersed in the dispersion is disposed in the receiving portions; and the dispersion comprises a material having a carbon number of 2 to 13.

15 Claims, 19 Drawing Sheets

(51) Int. Cl.
*G02F 1/13357* (2006.01)
*G02F 1/1343* (2006.01)

(58) Field of Classification Search
CPC ............ G02F 2001/1678; G02F 1/167; G02B 5/20; G02B 26/08; G06F 3/041; H10K 50/80; H10K 59/00
See application file for complete search history.

(56) References Cited

U.S. PATENT DOCUMENTS

| | | | |
|---|---|---|---|
| 9,341,915 B2* | 5/2016 | Yang | H01B 1/00 |
| 10,054,825 B2 | 8/2018 | Park et al. | |
| 11,493,477 B2 | 11/2022 | Ogawa et al. | |
| 2002/0027701 A1* | 3/2002 | Yanagisawa | G02F 1/167 |
| | | | 359/267 |
| 2008/0211734 A1* | 9/2008 | Huitema | G02F 1/1685 |
| | | | 345/3.1 |
| 2012/0062981 A1* | 3/2012 | Komatsu | G02F 1/167 |
| | | | 445/24 |
| 2012/0154898 A1 | 6/2012 | Kwon et al. | |
| 2012/0154900 A1* | 6/2012 | Kim | G02F 1/167 |
| | | | 359/296 |
| 2013/0020014 A1 | 1/2013 | Shin et al. | |
| 2013/0175480 A1 | 7/2013 | Yang et al. | |
| 2013/0264728 A1 | 10/2013 | Myoung et al. | |
| 2016/0037639 A1* | 2/2016 | Oh | H05K 1/144 |
| | | | 361/784 |
| 2016/0077273 A1 | 3/2016 | Kim et al. | |
| 2016/0143174 A1 | 5/2016 | Cho | |
| 2017/0168342 A1 | 6/2017 | Park et al. | |
| 2017/0309215 A1* | 10/2017 | Perdices-Gonzalez | G09G 3/32 |
| 2018/0074377 A1 | 3/2018 | You et al. | |
| 2018/0210312 A1 | 7/2018 | Liu et al. | |
| 2019/0064625 A1 | 2/2019 | Miller | |
| 2021/0247358 A1 | 8/2021 | Ogawa et al. | |
| 2021/0373403 A1 | 12/2021 | Kim et al. | |

FOREIGN PATENT DOCUMENTS

| | | |
|---|---|---|
| CN | 103443699 A | 12/2013 |
| CN | 104136982 A | 11/2014 |
| JP | 2010-85566 A | 4/2010 |
| JP | 2020-8513 A | 1/2020 |
| KR | 10-2013-0010164 A | 1/2013 |
| KR | 10-2013-0047026 A | 5/2013 |
| KR | 10-2016-0059562 A | 5/2016 |
| KR | 10-2017-0068024 A | 6/2017 |
| KR | 10-2017-0112369 A | 10/2017 |
| KR | 10-2019-0059262 A | 5/2019 |
| KR | 10-2020-0009144 A | 1/2020 |
| KR | 10-2020-0028078 A | 3/2020 |

OTHER PUBLICATIONS

Office Action dated Aug. 28, 2024 in Chinese Application No. 202180066051.2.
Office Action dated Jul. 18, 2024 in Korean Application No. 10-2020-0093885.

* cited by examiner

PUBLIC MODE

LIGHT PATH CONTROL MEMBER AND DISPLAY DEVICE COMPRISING SAME

CROSS-REFERENCE TO RELATED APPLICATIONS

This application is the U.S. national stage application of International Patent Application No. PCT/KR2021/009679, filed Jul. 27, 2021, which claims the benefit under 35 U.S.C. § 119 of Korean Application Nos. 10-2020-0093885, filed Jul. 28, 2020; and 10-2020-0093972, filed Jul. 28, 2020; the disclosures of each of which are incorporated herein by reference in their entirety.

TECHNICAL FIELD

An embodiment relates to A light path control member, and to a display device including the same.

BACKGROUND ART

A light blocking film blocks transmitting of light from a light source, and is attached to a front surface of a display panel which is a display device used for a mobile phone, a notebook, a tablet PC, a vehicle navigation device, a vehicle touch, etc., so that the light blocking film adjusts a viewing angle of light according to an incident angle of light to express a clear image quality at a viewing angle needed by a user when the display transmits a screen.

In addition, the light blocking film may be used for the window of a vehicle, building or the like to shield outside light partially to inhibit glare, or to inhibit the inside from being visible from the outside.

That is, the light blocking film may be A light path control member that controls the movement path of light to block light in a specific direction and transmit light in a specific direction. Accordingly, it is possible to control the viewing angle of the user by controlling a transmission angle of the light by the light blocking film.

Meanwhile, such a light blocking film may be divided into a light blocking film that can always control the viewing angle regardless of the surrounding environment or the user's environment and a switchable light blocking film that allow the user to turn on/off the viewing angle control according to the surrounding environment or the user's environment.

Such a switchable light blocking film may be implemented by converting a receiving portion into a light transmitting part and a light blocking part by filling the inside of the receiving portion with particles that may move when a voltage is applied and a dispersion liquid for dispersing the particles and by dispersing and aggregating the particles.

That is, the switchable light blocking film may include a plurality of receiving portions filled with the dispersion liquid in order to change a path of light.

The patterns are formed by filling a viscous dispersion as described above. Accordingly, there is a problem that the dispersion liquid flows out to the outside while the switchable light blocking film is in use, or impurities penetrate into the dispersion liquid, so that driving characteristics and reliability of the switchable light blocking film are deteriorated.

In addition, when the switchable light blocking film is combined with a display panel and the like to be used as a display device, a pattern of the switchable light blocking film and a pattern of the display panel may overlap to occur a moire phenomenon. Accordingly, when a user uses the display device, there is a problem that visibility is deteriorated due to moire.

Therefore, there is a need for a light path control member having a new structure capable of solving the above problems.

DISCLOSURE

Technical Problem

An embodiment relates to a light path control member having improved visibility and reliability, and to a display device including the same.

Technical Solution

A light path control member according to an embodiment includes: a first substrate; a first electrode disposed on the first substrate; a second substrate disposed on the first substrate; a second electrode disposed under the second substrate; and a light conversion part disposed between the first electrode and the second electrode, wherein the light conversion part includes a plurality of partition wall portions and a plurality of receiving portions alternately disposed, a light conversion material including a dispersion and a plurality of light conversion particles dispersed in the dispersion is disposed in the receiving portion, and the dispersion includes a material having a carbon number of 2 to 13.

Advantageous Effects

In a light path control member according to a first embodiment, a first cutting portion, a second cutting portion, a third cutting portion, and a fourth cutting portion that pass through an entire or a portion of a second substrate, a second electrode, a buffer layer, and a light conversion part may be formed on the second substrate.

In addition, a first sealing portion and a second sealing portion may be disposed inside the first cutting portion, the second cutting portion, the third cutting portion, and the fourth cutting portion, respectively.

The first sealing portion and the second sealing portion are disposed to seal an inlet and an outlet of a receiving portion for accommodating a light conversion material, and to extend along a side region of the light conversion part, that is, a side region in a first direction.

Accordingly, it is possible to inhibit the light conversion material inside the receiving portion from flowing out to the outside of the light conversion part by the first sealing portion, and it is possible to inhibit impurities from penetrating into the light conversion part from the outside by the first sealing portion and the second sealing portion, thereby improving the reliability of the light path control member.

In addition, since the first sealing portion and the second sealing portion are disposed inside the cutting portions formed on the second substrate, compared to forming the first sealing portion and the second sealing portion outside the light conversion part, the size of the light path control member may be reduced, and the sealing property of the light path control member may be improved by inhibiting the sealing member material from being denatured by an external environment.

In addition, in the light path control member according to the first embodiment, a first connection electrode may be disposed on a first protrusion, and a second connection electrode may be disposed on a second protrusion formed on the second substrate.

Surfaces of the first and second substrates may not entirely protrude, and the first protrusion and the second protrusion may protrude only by an area in which the first connection region and the second connection electrode may be formed.

Accordingly, the areas of the first protrusion and the second protrusion may be reduced. Therefore, when the light path control member is coupled to a display panel and applied to a display device, other components of the display device may be disposed in regions that do not correspond to the first protrusion and the second protrusion, thereby reducing a bezel region of the display device.

That is, the light path control member according to the first embodiment reduces the size of the bezel region where the connection electrode is disposed, thereby reducing the bezel region of the display device to which the light path control member is applied.

In addition, in the light path control member according to the first embodiment, a plurality of cutting portions is disposed on the second substrate, and an electrode connection portion is disposed inside a cutting portion to form the second connection electrode, thereby disposing the first connection electrode and the second connection electrode on the same plane.

Accordingly, it is possible to easily connect the first and second connection electrodes to a printed circuit board.

In addition, a contact area between the electrode connection portion and the second electrode may be increased by forming the cutting portions in which the electrode connection portion is disposed in plural, thereby improving electrical connection characteristics between the electrode connection portion and the second electrode.

In a light path control member according to a second embodiment, a receiving portion may be disposed by tilting the receiving portion at an inclination angle of a predetermined size with respect to a second direction of a substrate.

Accordingly, when the light path control member and a display panel are coupled to form a display device, it is possible to inhibit the occurrence of the moire phenomenon caused by overlapping a pattern of the receiving portion of the light path controlling member and a pixel pattern of the display panel.

Accordingly, when the user views the display device from the outside, it is possible to inhibit the pattern from being viewed due to the moire phenomenon caused by the overlapping of the pattern of the receiving portion of the light path control member and the pattern of the pixel of the display panel.

In addition, in the light path control member according to the second embodiment, a depth of a cutting portion defined as an inlet portion or an outlet portion among the plurality of cutting portions may be formed differently for each region.

Accordingly, when the light conversion material is injected into the inlet region, a moving path of the light conversion material may be increased, thereby facilitating injection of the light conversion material. In addition, by increasing a contact area of the first sealing portion disposed inside the cutting portion, it is possible to improve adhesive properties of the first sealing portion.

In addition, the optical path control member according to the second embodiment may inhibit an optical conversion material from flowing out to a side surface of the optical path control member as the accommodating portion is inclined.

That is, since a first sealing portion and a second sealing portion are disposed at ends of the optical path control member in the first and second directions to seal the optical conversion material inside the accommodating portion, it is possible to minimize the optical conversion material flowing out to the outside or external impurities penetrating into the optical conversion material.

In addition, by forming a region where the sealing portion and the optical conversion material are mixed, adhesive properties of the sealing portion may be improved by the anchor effect. Accordingly, it is possible to improve the adhesion of the sealing portion to inhibit delamination, thereby improving reliability and sealing properties of the optical path control member.

In addition, the light path control member according to the embodiment includes light conversion particles that move according to the application of voltage and a dispersion having a low viscosity and dispersing the light conversion particles.

That is, the dispersion includes a dispersion having a carbon number within a specific range, and thus, the viscosity of the dispersion may be reduced.

Accordingly, a mobility of the light conversion particles moving inside the dispersion may be improved, and a driving speed of the light path control member may be improved by improving the mobility of the light conversion particles.

In addition, since the light path control member according to the embodiment is improved fluidity by implementing a dispersion with a low viscosity, it is possible to improve a filling speed when the light conversion material including the dispersion is filled into the receiving portion, thereby improving process efficiency.

MODES OF THE INVENTION

Figure 1:
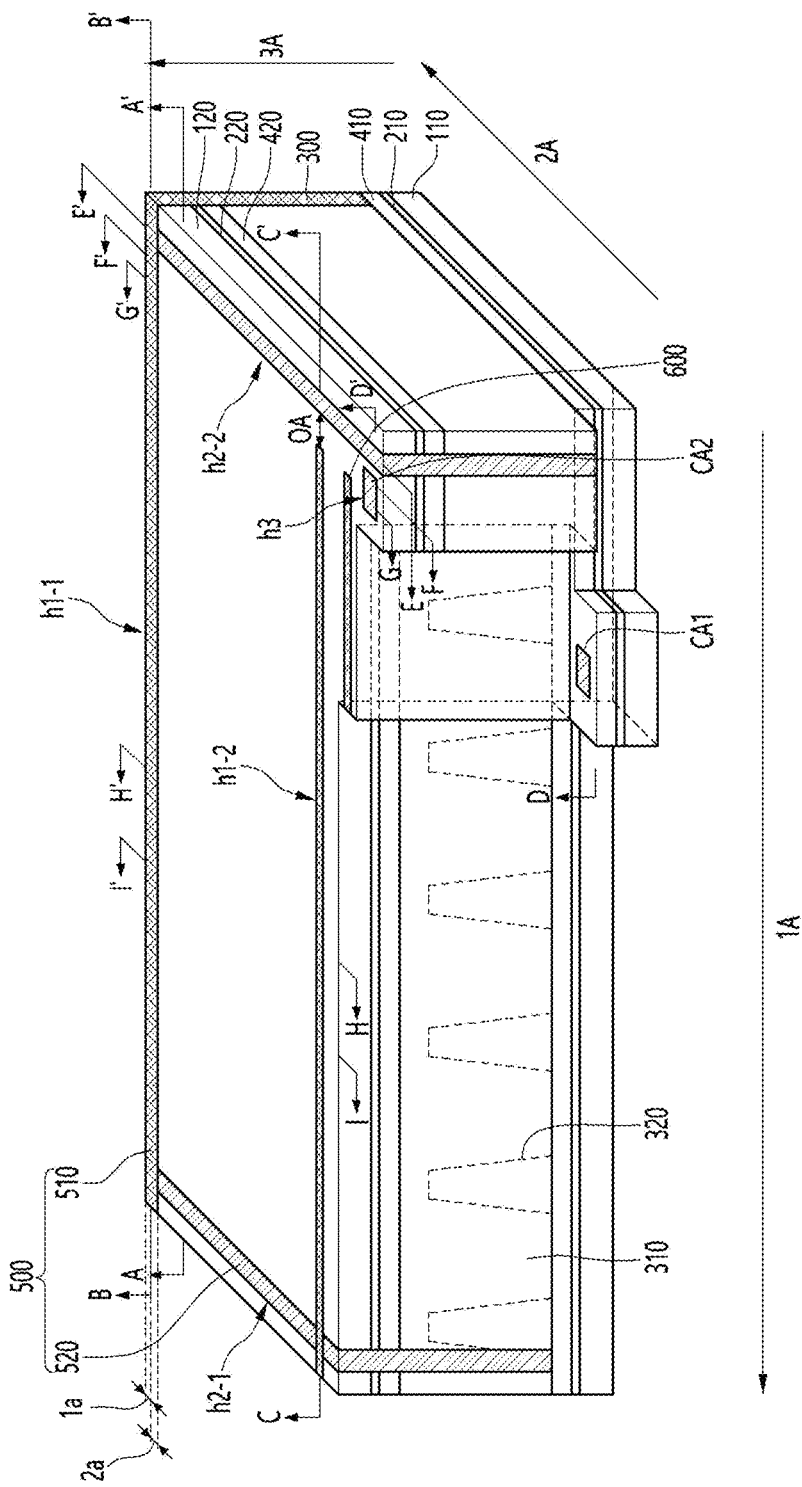
FIG. 1 is a perspective view of a light path control member according to a first embodiment.

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms) may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", or "coupled" to another element, it may include not only when the element is directly "connected" to, or "coupled" to other elements, but also when the element is "connected", or "coupled" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, A light path control member according to an embodiment will be described with reference to drawings. The light path control member described below relates to a switchable light path control member driven in various modes according to electrophoretic particles moving by application of a voltage.

Hereinafter. A light path control member according to a first embodiment will be described with reference to FIGS. 1 to 17.

Referring to FIGS. 1 to 17, a light path control member 1000 according to the first embodiment may include a first substrate 110, a second substrate 120, a first electrode 210, a second electrode 220, and a light conversion part 300.

The first substrate 110 may support the first electrode 210. The first substrate 110 may be rigid or flexible.

In addition, the first substrate 110 may be transparent. For example, the first substrate 110 may include a transparent substrate capable of transmitting light.

The first substrate 110 may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example, but the embodiment is not limited thereto.

In addition, the first substrate 110 may be a flexible substrate having flexible characteristics.

Further, the first substrate 110 may be a curved or bended substrate. That is, the light path control member including the first substrate 110 may also be formed to have flexible, curved, or bent characteristics. Accordingly, the light path control member according to the embodiment may be changed to various designs.

The first substrate 110 may extend in a first direction 1A, a second direction 2A, and a third direction 3A.

In detail, the first substrate 110 may include the first direction 1A corresponding to a length or width direction of the first substrate 110, a second direction 2A extending in a direction different from the first direction 1A and corresponding to the length or width direction of the first substrate 110, and a third direction 3A extending in a direction different from the first direction 1A and the second direction 2A and corresponding to a thickness direction of the first substrate 110.

For example, the first direction 1A may be defined as the length direction of the first substrate 110, the second direction 2A may be defined as the width direction of the first substrate 110 perpendicular to the first direction 1A, and the third direction 3A may be defined as the thickness direction of the first substrate 110. Alternatively, the first direction 1A may be defined as the width direction of the first substrate 110, the second direction 2A may be defined as the length direction of the first substrate 110 perpendicular to the first direction 1A, and the third direction 3A may be defined as the thickness direction of the first substrate 110.

Hereinafter, for convenience of description, the first direction 1A will be described as the length direction of the first substrate 110, the second direction 2A will be described as the width direction of the first substrate 110, and the third directions 3A will be described as the thickness direction of the first substrate 110.

The first electrode 210 may be disposed on one surface of the first substrate 110. In detail, the first electrode 210 may be disposed on an upper surface of the first substrate 110. That is, the first electrode 210 may be disposed between the first substrate 110 and the second substrate 120.

The first electrode 210 may include a transparent conductive material. For example, the first electrode 210 may include a conductive material having a light transmittance of about 80% or more. For example, the first electrode 210 may include a metal oxide such as indium tin oxide, indium zinc oxide, copper oxide, tin oxide, zinc oxide, titanium oxide, etc.

The first electrode 210 may have a thickness of 10 nm to 300 nm.

Alternatively, the first electrode 210 may include various metals to realize low resistance. For example, the first electrode 210 may include at least one metal of chromium (Cr), nickel (Ni), copper (Cu), aluminum (Al), silver (Ag), molybdenum (Mo). Gold (Au), titanium (Ti), and alloys thereof.

The first electrode 210 may be disposed on the entire surface of one surface of the first substrate 110. In detail, the first electrode 210 may be disposed as a surface electrode on one surface of the first substrate 110. However, the embodiment is not limited thereto, and the first electrode 210 may be formed of a plurality of pattern electrodes having a uniform pattern such as a mesh or stripe shape.

For example, the first electrode 210 may include a plurality of conductive patterns. In detail, the first electrode 210 may include a plurality of mesh lines crossing each other and a plurality of mesh openings formed by the mesh lines.

Accordingly, even though the first electrode 210 includes a metal, the first electrode 210 is not visually recognized from the outside, so that visibility may be improved. In addition, the light transmittance is increased by the openings, so that the brightness of the light path control member according to the embodiment may be improved.

The second substrate 120 may be disposed on the first substrate 110. In detail, the second substrate 120 may be disposed on the first electrode 210 on the first substrate 110.

The second substrate 120 may include a material capable of transmitting light. The second substrate 120 may include a transparent material. The second substrate 120 may include a material the same as or similar to that of the first substrate 110 described above.

For example, the second substrate 120 may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS). This is only an example, but the embodiment is not limited thereto.

In addition, the second substrate 120 may be a flexible substrate having flexible characteristics.

Further, the second substrate 120 may be a curved or bended substrate. That is, the light path control member including the second substrate 120 may also be formed to have flexible, curved, or bent characteristics. Accordingly, the light path control member according to the embodiment may be changed to various designs.

The second substrate 120 may also extend in the first direction 1A, the second direction 2A, and the third direction 3A in the same manner as the first substrate 110 described above.

In detail, the second substrate 120 may include the first direction 1A corresponding to a length or width direction of the second substrate 120, the second direction 2A extending in a direction different from the first direction 1A and corresponding to the length or width direction of the second substrate 120, and the third direction 3A extending in the direction different from the first direction 1A and the second direction 2A and corresponding to the thickness direction of the second substrate 120.

For example, the first direction 1A may be defined as the length direction of the second substrate 120, the second direction 2A may be defined as the width direction of the second substrate 120 perpendicular to the first direction 1A, and the third direction 3A may be defined as the thickness direction of the second substrate 120.

Alternatively, the first direction 1A may be defined as the width direction of the second substrate 120, the second direction 2A may be defined as the length direction of the second substrate 120 perpendicular to the first direction 1A, and the third direction 3A may be defined as the thickness direction of the second substrate 120.

Hereinafter, for convenience of description, the first direction 1A will be described as the length direction of the second substrate 120, the second direction 2A the second direction 2A will be described as the width direction of the second substrate 120, and the third directions 3A will be described as the thickness direction of the second substrate 120.

The second electrode 220 may be disposed on one surface of the second substrate 120. In detail, the second electrode 220 may be disposed on a lower surface of the second substrate 120. That is, the second electrode 220 may be disposed on one surface of the second substrate 120 in which the second substrate 120 and the first substrate 110 face each other. That is, the second electrode 220 may be disposed to face the first electrode 210 on the first substrate 110. That is, the second electrode 220 may be disposed between the first electrode 210 and the second substrate 120.

The second electrode 220 may include a material the same as or similar to that of the first substrate 110 described above.

The second electrode 220 may include a transparent conductive material. For example, the second electrode 220 may include a conductive material having a light transmittance of about 80% or more. As an example, the second electrode 220 may include a metal oxide such as indium tin oxide, indium zinc oxide, copper oxide, tin oxide, zinc oxide, titanium oxide, etc.

The second electrode 220 may have a thickness of about 10 nm to about 300 nm.

Alternatively, the second electrode 220 may include various metals to realize low resistance. For example, the second electrode 220 may include at least one metal of chromium (Cr), nickel (Ni), copper (Cu), aluminum (Al), silver (Ag), molybdenum (Mo). Gold (Au), titanium (Ti), and alloys thereof.

The second electrode 220 may be disposed on the entire surface of one surface of the second substrate 120. However, the embodiment is not limited thereto, and the second electrode 220 may be formed of a plurality of pattern electrodes having a uniform pattern such as a mesh or stripe shape.

For example, the second electrode 220 may include a plurality of conductive patterns. In detail, the second electrode 220 may include a plurality of mesh lines crossing each other and a plurality of mesh openings formed by the mesh lines.

Accordingly, even though the second electrode 220 includes a metal, the second electrode 220 is not visually recognized from the outside, so that visibility may be improved. In addition, the light transmittance is increased by the openings, so that the brightness of the light path control member according to the embodiment may be improved.

A cutting portion may be formed on the second substrate 120. In detail, the second substrate 120 may include a plurality of cutting portions.

Referring to FIG. 1, the second substrate 120 may include a 1-1 cutting portion h1-1, a 1-2 cutting portion h1-2, a 2-1 cutting portion h2-1, and a 2-2 cutting portion h2-2.

The 1-1 cutting portion h1-1, the 1-2 cutting portion h1-2, the 2-1 cutting portion h2-1, and the 2-2 cutting portion h2-2 may be formed in a hole shape or a groove shape.

For example, at least one of the 1-1 cutting portion h1-1, the 1-2 cutting portion h1-2, the 2-1 cutting portion h2-1, and the 2-2 cutting portion h2-2 may be formed in a groove shape in which one end that is an upper surface of the second substrate is opened and the other end that is a lower surface of the light conversion part is closed. In addition, at least one of the 1-1 cutting portion h1-1, the 1-2 cutting portion h1-2, the 2-1 cutting portion h2-1, and the 2-2 cutting portion h2-2 may be formed in a groove shape in which one end that is the upper surface of the second substrate is opened, the other end that is the lower surface of the light conversion part is opened or closed, and any one of both side portions that is perpendicular to a length direction of the cutting portion is opened.

In detail, the 1-1 cutting portion h1-1, the 2-1 cutting portion h2-1, and the 2-2 cutting portion h2-2 may be disposed inside the second substrate 120. Accordingly, the 1-1 cutting portion h1-1, the 2-1 cutting portion h2-1, and the 2-2 cutting portion h2-2 may be formed in a groove shape in which one end that is the upper surface of the second substrate is opened and the other end that is the lower surface of the light conversion part is closed.

In addition, the 1-2 cutting portions h1-2 may be disposed on the upper surface and one side surface of the second substrate. Accordingly, the 1-2 cutting portions h1-2 may be formed in a groove shape in which one end that is the upper surface of the second substrate is opened, the other end that is the lower surface of the light conversion part is closed, and one side portion of the cutting portion that is perpendicular to the length direction of the cutting portion is opened.

The 1-1 cutting portion h1-1, the 1-2 cutting portion h1-2, the 2-1 cutting portion h2-1, and the 2-2 cutting portion h2-2 may extend from the second substrate 120 toward the first substrate 110.

At least one of the 1-1 cutting portion h1-1, the 1-2 cutting portion h1-2, the 2-1 cutting portion h2-1, and the 2-2 cutting portion h2-2 may be formed in a shape in which a long width and/or a short width are narrowed while extending from the second substrate 120 toward the first substrate 110. The 1-1 cutting portion h1-1 and the 1-2 cutting portion h1-2 may be disposed to face each other. In detail, the 1-1 cutting portion h1-1 and the 1-2 cutting portion h1-2 may extend in the first direction 1A of the second substrate 120, and the 1-1 cutting portion h1-1 and the 1-2 cutting portion h1-2 may be disposed to face each other. That is, the 1-1 cutting portion h1-1 and the 1-2 cutting portion h1-2 may extend in the length direction of the second substrate 120, and the 1-1 cutting portion h1-1 and the 1-2 cutting portions h1-2 may be disposed to face each other.

The 1-1 cutting portion h1-1 and the 1-2 cutting portion h1-2 may have the same shape and area. Alternatively, the 1-1 cutting portion h1-1 and the 1-2 cutting portion h1-2 may have different shapes and/or areas.

At least one of the 1-1 cutting portion h1-1 and the 1-2 cutting portion h1-2 may be disposed to be spaced apart from or in contact with both ends of the second substrate 120.

The 2-1 cutting portion h2-1 and the 2-2 cutting portion h2-2 may be disposed to face each other. In detail, the 2-1 cutting portion h2-1 and the 2-2 cutting portion h2-2 may extend in the second direction 2A of the second substrate 120, and the 2-1 cutting portion h2-1 and the 2-2 cutting portion h2-2 may be disposed to face each other. That is, the 2-1 cutting portion h2-1 and the 2-2 cutting portion h2-2 may extend in the width direction of the second substrate 120, and the 2-1 cutting portion h2-1 and the 2-2 cutting portion h2-2 may be disposed to face each other.

The 2-1 cutting portion h2-1 and the 2-2 cutting portion h2-2 may have the same shape and area. Alternatively, the 2-1 cutting portion h2-1 and the 2-2 cutting portion h2-2 may have different shapes and/or areas.

At least one of the 2-1 cutting portion h2-1 and the 2-2 cutting portion h2-2 may be disposed to be spaced apart from or in contact with both ends of the second substrate 120.

Accordingly, the 1-1 cutting portion h1-1, the 1-2 cutting portion h1-2, the 2-1 cutting portion h2-1, and the 2-2 cutting portion h2-2 may be disposed to extend along an edge of the second substrate 120.

At least two of the 1-1 cutting portion h1-1, the 1-2 cutting portion h1-2, the 2-1 cutting portion h2-1, and the 2-2 cutting portion h2-2 may be connected to each other. In addition, at least two of the 1-1 cutting portion h1-1, the 1-2 cutting portion h1-2, the 2-1 cutting portion h2-1, and the 2-2 cutting portion h2-2 may be disposed to be spaced apart from each other.

For example, referring to FIG. 1, the 1-1 cutting portion h1-1 may be connected to the 2-1 cutting portion h2-1 and the 2-2 cutting portion h2-2, the 1-2 cutting portion h1-2 may be connected to the 2-1 cutting portion h2-1, the 2-1 cutting portion h2-1 may be connected to the 1-1 cutting portion h1-1 and the 1-2 cutting portion h1-2, and the 2-2 cutting portion h2-2 may be connected to the 1-1 cutting portion h1-1. Accordingly, the 1-2 cutting portion h1-2 and the 2-2 cutting portion h2-2 may be disposed to be spaced apart from each other.

Accordingly, an open region OA formed between the 1-2 cutting portion h1-2 and the 2-2 cutting portion h2-2 may be formed in the second substrate 120.

A current and a voltage applied from an electrode connection portion 700 of a second connection region CA2 by the open region OA may be transmitted in a direction of the receiving portion 320 of the light conversion part 300 through the second electrode 220.

Meanwhile, at least one of the 1-1 cutting portion h1-1, the 1-2 cutting portion h1-2, the 2-1 cutting portion h2-1, and the 2-2 cutting portion h2-2 may be formed in the second substrate 120. That is, all of the 1-1 cutting portion h1-1, the 1-2 cutting portion h1-2, the 2-1 cutting portion h2-1, and the 2-2 cutting portions h2-2 may be formed in the second substrate 120, or some of the 1-1 cutting portion h1-1, the 1-2 cutting portion h1-2, and the 2-1 cutting portion 2-1, and the 2-2 cutting portion h2-2 may be omitted, and only at least one may be formed. The number of the cutting portions may vary depending on a manufacturing process of the light path control member.

The 1-1 cutting portion h1-1, the 1-2 cutting portion h1-2, the 2-1 cutting portion h2-1, and the 2-2 cutting portion h2-2 may be formed through the second substrate 120. In addition, the 1-1 cutting portion h1-1, the 1-2 cutting portion h1-2, the 2-1 cutting portion h2-1, and the 2-2 cutting portion h2-2 may be formed to pass through at least one of the second substrate 120, the light conversion part 300, and the second electrode 220. Penetration depths of the 1-1 cutting portion h1-1, the 1-2 cutting portion h1-2, the 2-1 cutting portion h2-1 and the 2-2 cutting portion h2-2 will be described in detail below.

In addition, a sealing material may be disposed in the 1-1 cutting portion h1-1, the 1-2 cutting portion h1-2, the 2-1 cutting portion h2-1, and the 2-2 cutting portion h2-2. Accordingly, the sealing material may be disposed inside the 1-1 cutting portion h1-1, the 1-2 cutting portion h1-2, the 2-1 cutting portion h2-1, and the 2-2 cutting portion h2-2 to form a sealing portion 500.

That is, a first sealing portion 510 may be disposed on the 1-1 cutting portion h1-1 and the 1-2 cutting portion h1-2, and a second sealing portion 520 may be disposed on the 2-1 cutting portion h2-1 and the 2-2 cutting portion h2-2.

Meanwhile, in order to minimize a bezel region of the light path control member, in at least one of the 1-1 cutting portion h1-1, the 1-2 cutting portion h1-2, and the 2-1 cutting portion h2-1, and the 2-2 cutting portion h2-2, a part of the cutting portion may be the outermost surface of the light path control member by removing an entire or a portion of at least one outer surface of the cutting portion and from an outer surface of the cutting portion to an outer surface of the substrate.

For example, since an open region is formed by removing from the outer surface of the cutting portion to the outer surface of the second substrate, the outermost portion of the light path controlling member in the open region may be a part of the cutting portion, that is, the sealing portion may be the outermost surface of the light path controlling member. Accordingly, at least one of the first sealing portion 510 and the second sealing portion 520 may be the outermost surface of the light path control member.

The sealing portion 500 disposed inside the cutting portions will be described in detail below.

The first substrate 110 and the second substrate 120 may have the same or different sizes. That is, the first substrate 110 and the second substrate 120 may have lengths corresponding to each other and different areas.

In detail, a first length extending in the first direction 1A of the first substrate 110 may have a size the same as or similar to a second length extending in the first direction 1A of the second substrate 120.

For example, the first length and the second length may have a size of 300 mm to 400 mm.

In addition, a first width extending in the second direction 2A of the first substrate 110 may have a size the same as or similar to a second width extending in the second direction of the second substrate 120.

For example, the first width and the second width may have a size of 150 mm to 200 mm.

In addition, a first thickness extending in the third direction 3A of the first substrate 110 may have a size the same as or similar to a second thickness extending in the third direction of the second substrate 120.

For example, the first thickness and the second thickness may have a size of 1 mm or less.

In addition, the first substrate 110 and the second substrate 120 may have different areas.

Figure 2:
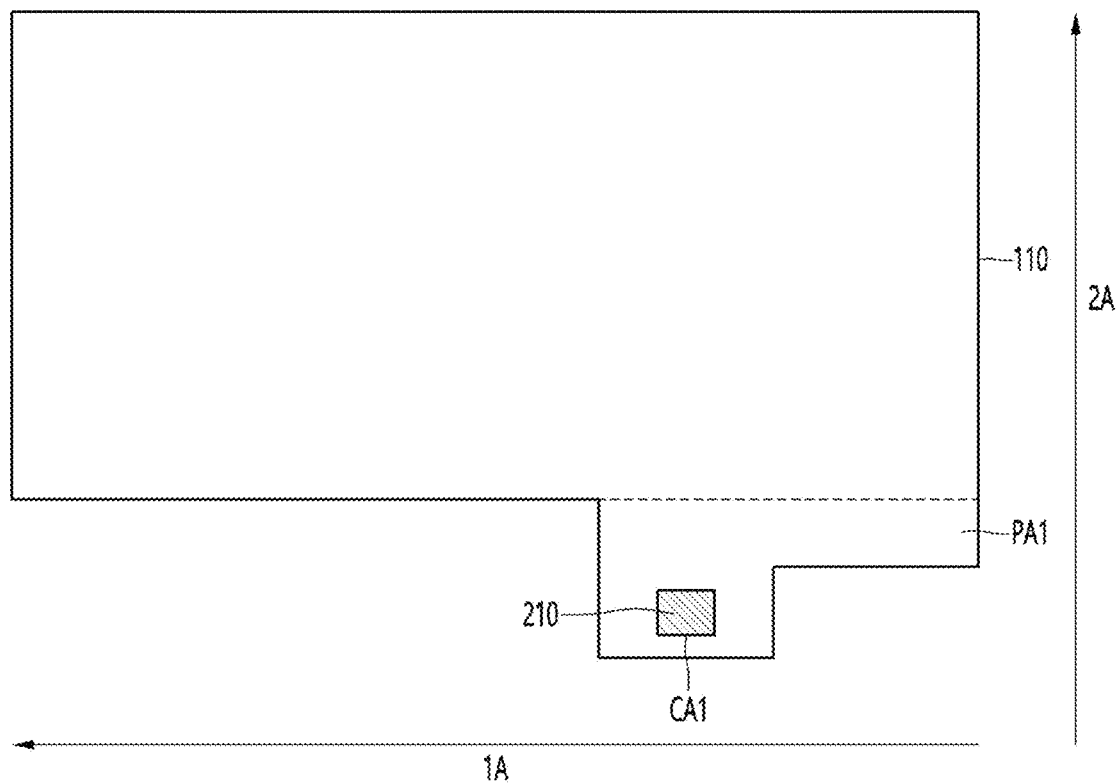
FIG. 2 is a top view of a first substrate of the light path control member according to the first embodiment.
Figure 3:
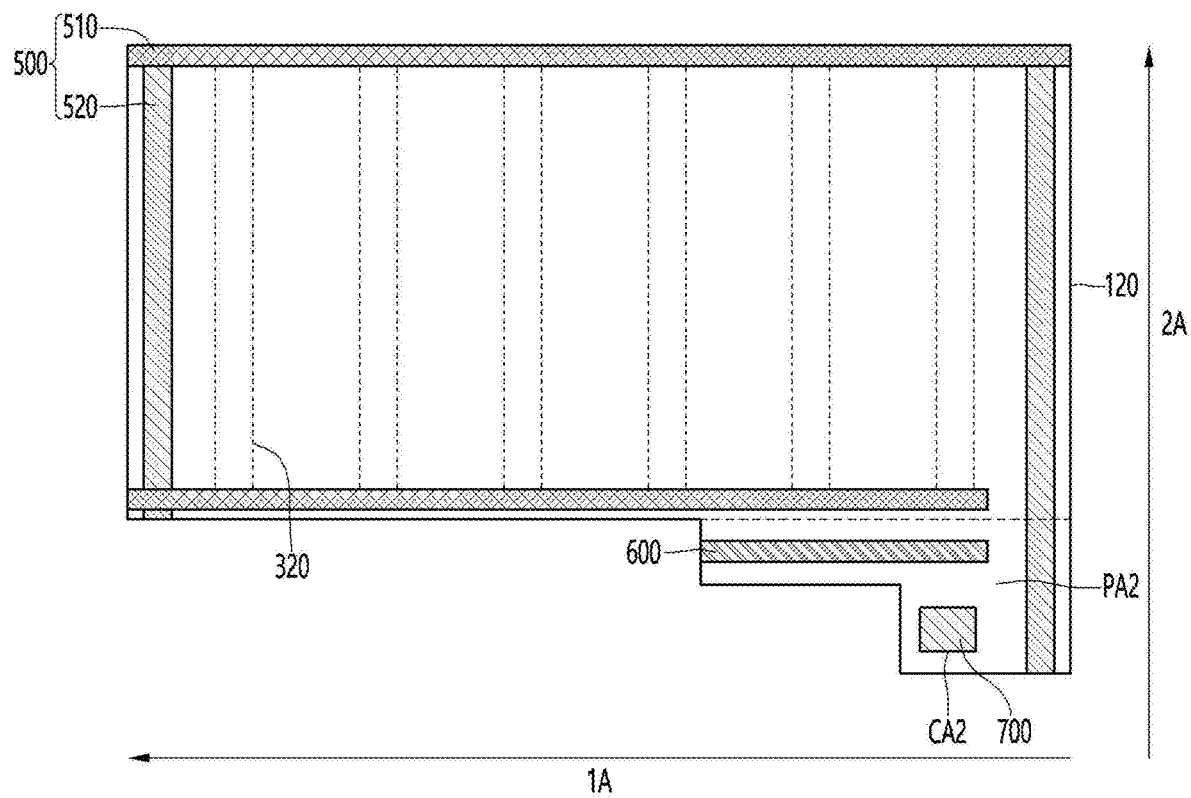
FIG. 3 is a top view of a second substrate of the light path control member according to the first embodiment.

In detail, the first substrate 110 and the second substrate 120 may include a protrusion. Referring to FIGS. 2 and 3, the first substrate 110 may include a first protrusion PA1, and the second substrate 120 may include a second protrusion PA2. In detail, the first substrate 110 and the second substrate 120 may include the first protrusion PA1 and the second protrusion PA2 that are disposed to be misaligned from each other, respectively.

Alternatively, the embodiment is not limited thereto, and the first protrusion PA1 and the second protrusion PA2 may include an overlapping region overlapping each other and a non-overlapping region not overlapping each other. That is, the first protrusion PA1 and the second protrusion PA2 may include the overlapping region overlapping each other and the non-overlapping region not overlapping each other in the third direction.

In this case, the first protrusion PA1 and the second protrusion PA2 may have different areas. That is, the first substrate 110 and the second substrate 120 may have different sizes by a difference in size of the protrusions.

A connection region connected to an external printed circuit board or a flexible printed circuit board may be formed in the first protrusion PA1 of the first substrate 110 and the second protrusion PA2 of the second substrate 120, respectively.

In detail, a first connection region CA1 may be disposed on the first protrusion PA1, and a second connection region CA2 may be disposed on the second protrusion PA2. When the first protrusion PA1 and the second protrusion PA2 are disposed at positions misaligned from each other, the first connection region CA1 and the second connection region CA2 may be disposed so as not to overlap in the third direction 3A.

A conductive material may be exposed on upper surfaces of the first connection region CA1 and the second connection region CA2, respectively, and the light path control member may be electrically connected to the external printed circuit board or the flexible printed circuit board through the first connection region CA1 and the second connection region CA2.

For example, a pad portion may be disposed on the first connection region CA1 and the second connection region CA2, and a conductive adhesive including at least one of an anisotropic conductive film (ACF) and anisotropic conductive pastes (ACP) may be disposed between the pad portion and the printed circuit board or the flexible printed circuit board to connect the light path control member.

Alternatively, the conductive adhesive including at least one of an anisotropic conductive film (ACF) and anisotropic conductive pastes (ACP) may be disposed between the first connection region CA1 and the second connection region CA2 and the printed circuit board or the flexible printed circuit board to direct connect the light path control member without the pad portion.

The conductive material constituting the first connection region CA1 and the second connection region CA2 will be described in detail below.

The light conversion part 300 may be disposed between the first substrate 110 and the second substrate 120. In detail, the light conversion part 300 may be disposed between the first electrode 210 and the second electrode 220.

An adhesive layer or a buffer layer may be disposed between at least one of between the light conversion part 300 and the first substrate 110 or between the light conversion part 300 and the second substrate 120, and the first substrate 110, the second substrate 120, and the light conversion part 300 may be adhered to each other by the adhesive layer and/or the buffer layer.

For example, an adhesive layer 410 may be disposed between the first electrode 210 and the light conversion part 300, thereby adhering the first substrate 110 and the light conversion part 300.

In addition, a buffer layer 420 may be disposed between the second electrode 220 and the light conversion part 300, thereby improving adhesion between the second electrode 220 including different materials and the light conversion part 300.

The above-described cutting portions may be formed to pass through an entire or a portion of the buffer layer 420 and the light conversion part 300. That is, the cutting portion may pass through the second substrate 120, the second electrode 220, and the buffer layer 420 in the third direction and may pass through an entire or a portion of the light conversion part 300.

The light conversion part 300 may include a plurality of partition wall portions and receiving portions. A light conversion material 330 including light conversion particles that move by application of a voltage and a dispersion liquid for dispersing the light conversion particles may be disposed in the receiving portion 320, and light transmission characteristics of the light path control member may be changed by the light conversion particles.

In addition, the sealing portion 500 for sealing the light conversion material 330 and the dam portion 600 for easily injecting the light conversion material 330 may be disposed in the receiving portion 320.

Figure 4:
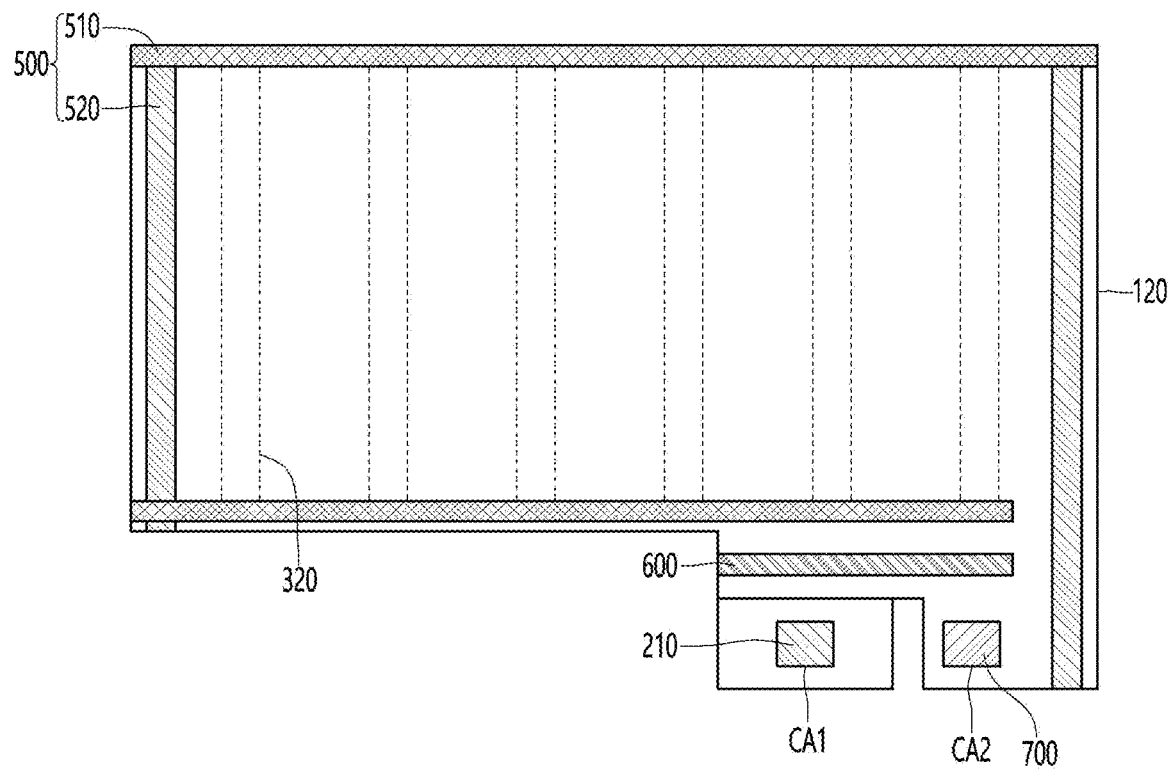
FIG. 4 is a top view of the second substrate in which the first and second substrates of the light path control member are laminated according to the first embodiment.

Referring to FIGS. 3 and 4, the receiving portion 320 may be disposed to extend in one direction. In detail, the receiving portion 320 may extend in a direction corresponding to the second direction 2A of the first substrate 110 or the second substrate 120. That is, the receiving portion 320 may be disposed to extend in a direction corresponding to the width direction of the first substrate 110 or the second substrate 120.

Accordingly, both ends of the receiving portion 320 of the light path control member according to the first embodiment may be disposed to face both ends of the first substrate 110 or the second substrate 120, respectively. That is, one end of the receiving portion 320 may be disposed to face one end of the first substrate 110 or the second substrate 120 in the second direction 2A. The other end of the receiving portion 320 may be disposed to face the other end of the first substrate 110 or the second substrate 120 in the second direction 2A.

Accordingly, both ends of the receiving portion 320 may be disposed in contact with the first sealing portion 510 disposed to face in the second direction 2A and may be disposed to be spaced apart from the second sealing portion 520.

Meanwhile, although not shown in the drawings, the receiving portion 320 may be disposed to extend up to the second protrusion, and the receiving portion 320 on the second protrusion may not include the light conversion material or may include less the light conversion material than other receiving portions.

Figure 5:
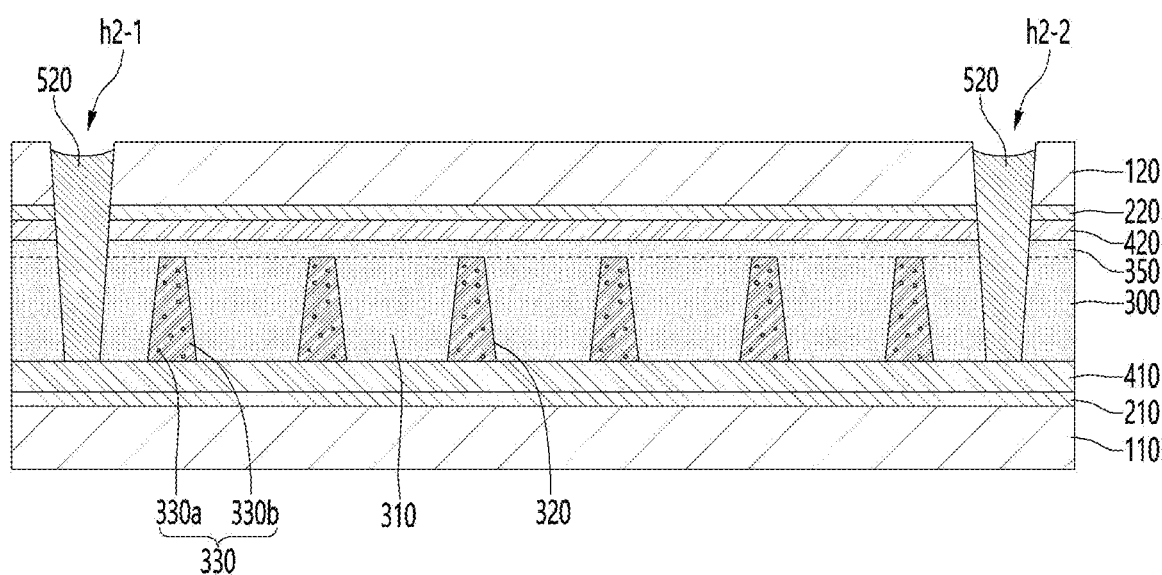
FIGS. 5 and 6 are cross-sectional views taken along line A-A' in FIG. 1.
Figure 6:
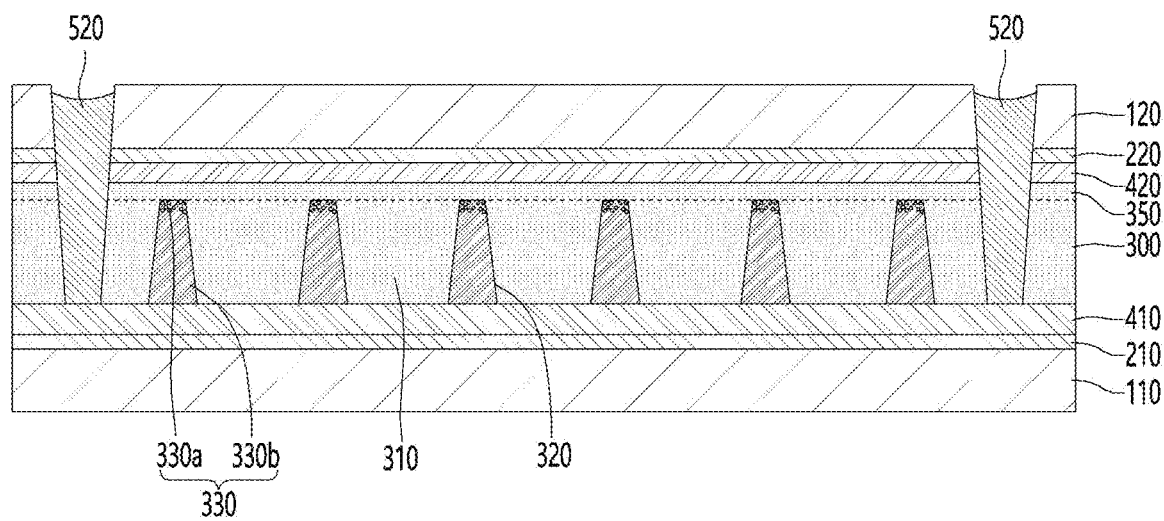

FIGS. 5 and 6 are cross-sectional views taken along line A-A' in FIG. 1.

Referring to FIGS. 5 and 6, the light conversion part 300 may the partition wall portion 310 and the receiving portion 320.

The partition wall portion 310 may be defined as a partition wall portion dividing the receiving portion. That is, the partition wall portion 310 may transmit light as a barrier region dividing a plurality of receiving portions. That is, light emitted in the direction of the first substrate 110 or the second substrate 120 may pass through the partition wall portion.

The partition wall portion 310 and the receiving portion 320 may be disposed to extend in the second direction 2A of the first substrate 110 and the second substrate 120. That is, the partition wall portion 310 and the receiving portion 320 may be disposed to extend in the width direction or the length direction of the first substrate 110 and the second substrate 120.

The partition wall portion 310 and the receiving portion 320 may be disposed to have different widths. For example, a width of the partition wall portion 310 may be greater than that of the receiving portion 320.

In addition, the receiving portion 320 may be formed in a shape extending from the first electrode 210 toward the second electrode 220 and narrowing in width.

The partition wall portion 310 and the receiving portion 320 may be alternately disposed with each other. In detail, the partition wall portion 310 and the receiving portion 320 may be alternately disposed with each other. That is, each of the partition wall portions 310 may be disposed between the receiving portions 320 adjacent to each other, and each of the receiving portions 320 may be disposed between the partition wall portions 310 adjacent to each other.

The partition wall portion 310 may include a transparent material. The partition wall portion 310 may include a material that may transmit light.

The partition wall portion 310 may include a resin material. For example, the partition wall portion 310 may include a photo-curable resin material. As an example, the partition wall portion 310 may include a UV resin or a transparent photoresist resin. Alternatively, the partition wall portion 310 may include urethane resin or acrylic resin.

The receiving portion 320 may be formed to partially penetrate the light conversion part 300. Accordingly, the receiving portion 320 may be disposed in contact with the adhesive layer 410 and may be disposed to be spaced apart from the buffer layer 420. Accordingly, a base portion 350 may be formed between the receiving portion 320 and the buffer layer 420.

Alight conversion material 330 including light conversion particles 330a and a dispersion liquid 330b in which the light conversion particles 330a are dispersed may be disposed in the receiving portion 320.

The dispersion liquid 330b may be a material for dispersing the light conversion particles 330a. The dispersion liquid 330b may include a transparent material. The dispersion liquid 330b may include a non-polar solvent. In addition, the dispersion liquid 330b may include a material capable of transmitting light. For example, the dispersion liquid 330b may include at least one of a halocarbon-based oil, a paraffin-based oil, and isopropyl alcohol.

The light conversion particles 330a may be disposed to be dispersed in the dispersion liquid 330b. In detail, the plurality of light conversion particles 330a may be disposed to be spaced apart from each other in the dispersion liquid 330b.

The light conversion particles 330a may include a material capable of absorbing light. That is, the light conversion particles 330a may be light absorbing particles. The light conversion particles 330a may have a color. For example, the light conversion particles 330a may have a black-based color. As an example, the light conversion particles 330a may include carbon black.

The light conversion particles 330a may have a polarity by charging a surface thereof. For example, the surface of the light conversion particles 330a may be charged with a negative (−) charge. Accordingly, according to the application of the voltage, the light conversion particles 330a may move toward the first electrode 210 or the second electrode 220.

The light transmittance of the receiving portion 320 may be changed by the light conversion particles 330a. In detail, the receiving portion 320 may be converted into the light blocking part and the light transmitting part by changing the light transmittance due to the movement of the light conversion particles 330a. That is, the receiving portion 320 may change the transmittance of light passing through the receiving portion 320 by dispersion and aggregation of the light conversion particles 330a disposed inside the dispersion liquid 330b.

For example, the light path control member according to the embodiment may be switched from a first mode to a second mode or from the second mode to the first mode by a voltage applied to the first electrode 210 and the second electrode 220.

In detail, in the light path control member according to the first embodiment, the receiving portion 320 becomes the light blocking part in the first mode, and light of a specific angle may be blocked by the receiving portion 320. That is, a viewing angle of the user viewing from the outside is narrowed, so that the light path control member may be driven in a privacy mode.

In addition, in the light path control member according to the first embodiment, the receiving portion 320 becomes the light transmitting part in the second mode, and in the light path control member according to the first embodiment, light may be transmitted through both the partition wall portion 310 and the receiving portion 320. That is, the viewing angle of the user viewing from the outside may be widened, so that the light path control member may be driven in a public mode.

Switching from the first mode to the second mode, that is, the conversion of the receiving portion 320 from the light blocking part to the light transmitting part may be realized by movement of the light conversion particles 330a of the receiving portion 320. That is, the light conversion particles 330a may have a charge on the surface thereof and may move toward the first electrode or the second electrode according to the application of a voltage according to characteristics of the charge. That is, the light conversion particles 330a may be electrophoretic particles.

For example, when a voltage is not applied to the light path control member from the outside, the light conversion particles 330a of the receiving portion 320 are uniformly dispersed in the dispersion liquid 330b, and the receiving portion 320 may block light by the light conversion particles. Accordingly, in the first mode, the receiving portion 320 may be driven as the light blocking part.

In addition, when a voltage is applied to the light path control member from the outside, the light conversion particles 330a may move. For example, the light conversion particles 330a may move toward one end or the other end of the receiving portion 320 by a voltage transmitted through the first electrode 210 and the second electrode 220. That is, the light conversion particles 330a may move from the receiving portion 320 toward the first electrode 210 or the second electrode 220.

For example, when a voltage is applied to the first electrode 210 and/or the second electrode 220, an electric field is formed between the first electrode 210 and the second electrode 220, and the light conversion particles 330a charged with the negative charge may move toward a positive electrode of the first electrode 210 and the second electrode 220 using the dispersion liquid 330b as a medium.

As an example, in the initial mode or when the voltage is not applied to the first electrode 210 and/or the second electrode 220, as shown in FIG. 5, the light conversion particles 330a may be uniformly dispersed in the dispersion liquid 330b, and the receiving portion 320 may be driven as the light blocking part.

Figure 8:
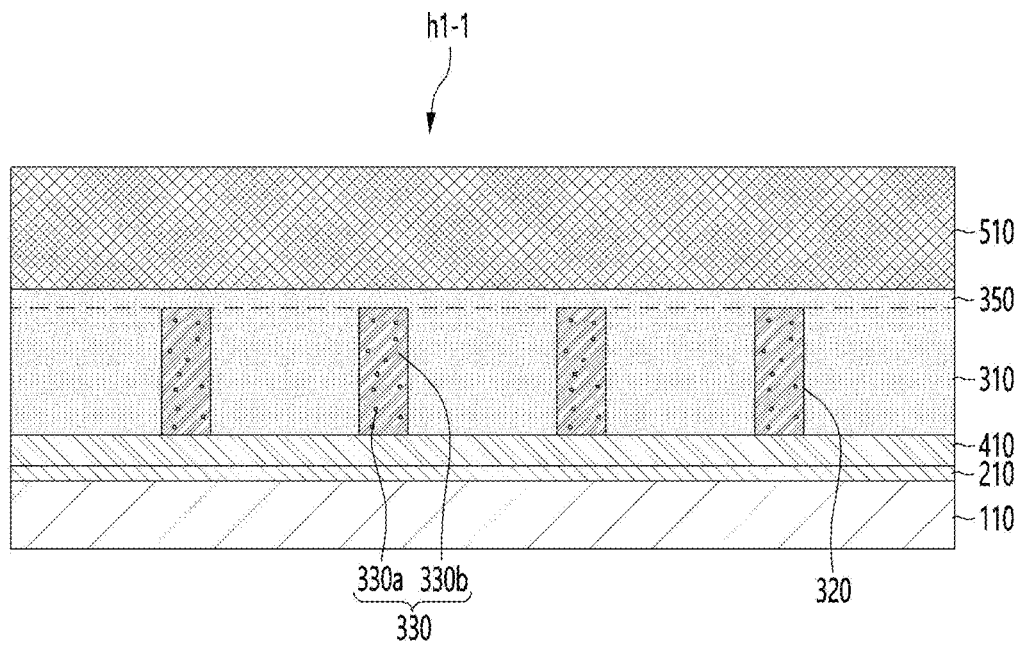

In addition, when the voltage is applied to the first electrode 210 and/or the second electrode 220, as shown in FIG. 8, the light conversion particles 330a may move toward the second electrode 220 in the dispersion liquid 330b. That is, the light conversion particles 330a move in one direction, and the receiving portion 320 may be driven as the light transmitting part.

Accordingly, the light path control member according to the embodiment may be driven in two modes according to a user's surrounding environment. That is, when the user requires light transmission only at a specific viewing angle, the receiving portion is driven as the light blocking part, or in an environment in which the user requires high brightness, a voltage may be applied to drive the receiving portion as the light transmitting part.

Therefore, since the light path control member according to the embodiment may be implemented in two modes according to the user's requirement, the light path control member may be applied regardless of the user's environment.

The second sealing portion 520 may be disposed on the outermost side of the light path control member. In detail, the second sealing portion 520 extending in the second direction 2A and facing each other may be disposed on the outermost side of the light path control member in the first direction 1A.

The second sealing portion 520 may be disposed inside the cutting portions described above. In detail, the second sealing portion 520 may be disposed inside the 2-1 cutting portion h2-1 and the 2-2 cutting portion h2-2.

That is, the 2-1 cutting portion h2-1 and the 2-2 cutting portion h2-2 may be formed to sequentially pass through the second substrate 120, the second electrode 220, the buffer layer 420, and the light conversion part 300 which is including the base portion 350 and the partition wall portion 310, and the second sealing portion 520 may be formed by disposing the sealing material inside the 2-1 cutting portion h2-1 and the 2-2 cutting portion h2-2.

That is, one surface of the adhesive layer 410 may be exposed through the 2-1 cutting portion h2-1 and the 2-2 cutting portion h2-1, and the second sealing portion 520 may be disposed in contact with the adhesive layer 410.

The second sealing portion 520 may be disposed in contact with a side surface of the second substrate 120. In addition, the second sealing portion 520 may be disposed in contact with a side surface of the second electrode 220. In addition, the second sealing portion 520 may be disposed in contact with a side surface of the buffer layer 420. In addition, the second sealing portion 520 may be disposed in contact with a side surface of the base portion 350. In addition, the second sealing portion 520 may be disposed in contact with a side surface of the partition wall portion 310.

The second sealing portion 520 may be disposed on a side surface of the light path control member, that is, a side surface in the second direction 2A, to inhibit impurities that may penetrate from the outside from penetrating into the light conversion part 300.

The second sealing portion 520 may be disposed to completely fill the 2-1 cutting portion h2-1 and the 2-2 cutting portion h2-2 or may be disposed to have a height lower than depths of the 2-1 cutting portion h2-1 and the 2-2 cutting portion h2-2. Accordingly, as shown in FIGS. 5 and 6, an upper surface of the second sealing portion 520 may be disposed to have a height lower than an upper surface of the second substrate 120. That is, a step may be formed between the upper surface of the second sealing portion 520 and the upper surface of the second substrate 120. In addition, the upper surface of the second sealing portion 520 may be formed in a concave shape.

Meanwhile, in FIGS. 5 and 6, it is illustrated that the 2-1 cutting portion h2-1 and the 2-2 cutting portion h2-2 are formed up to a depth at which one surface of the adhesive layer 410 is exposed, but the embodiment is not limited thereto.

That is, the depths of the 2-1 cutting portion h2-1 and the 2-2 cutting portion h2-2 may vary through a process method, a process time, and the like for forming the 2-1 cutting portion h2-1 and the 2-2 cutting portion h2-2. h2-2.

For example, at least one of the 2-1 cutting portion h2-1 and the 2-2 cutting portion h2-2 may be formed up to a depth partially passing through the light conversion part 300, and accordingly, one surface of the base portion, the partition wall portion 310 or the receiving portion 320 may be exposed by the 2-1 cutting portion h2-1 and the 2-2 cutting portion h2-2.

Accordingly, the second sealing portion 520 may be disposed to be spaced apart from the adhesive layer 410.

Alternatively, at least one of the 2-1 cutting portion h2-1 and the 2-2 cutting portion h2-2 may be formed up to a depth partially passing through the adhesive layer 410, and accordingly, one surface of the adhesive layer 410 may be exposed by the 2-1 cutting portion h2-1 and the 2-2 cutting portion h2-2.

Alternatively, at least one of the 2-1 cutting portion h2-1 and the 2-2 cutting portion h2-2 may be formed up to a depth partially passing through the first electrode 210, and accordingly, one surface of the first electrode 210 may be exposed by the 2-1 cutting portion h2-1 and the 2-2 cutting portion h2-2.

Alternatively, at least one of the 2-1 cutting portion h2-1 and the 2-2 cutting portion h2-2 may be formed up to a depth partially passing through the first substrate 110, and accordingly, one surface of the first substrate 110 may be exposed by the 2-1 cutting portion h2-1 and the 2-2 cutting portion h2-2.

Figure 7:
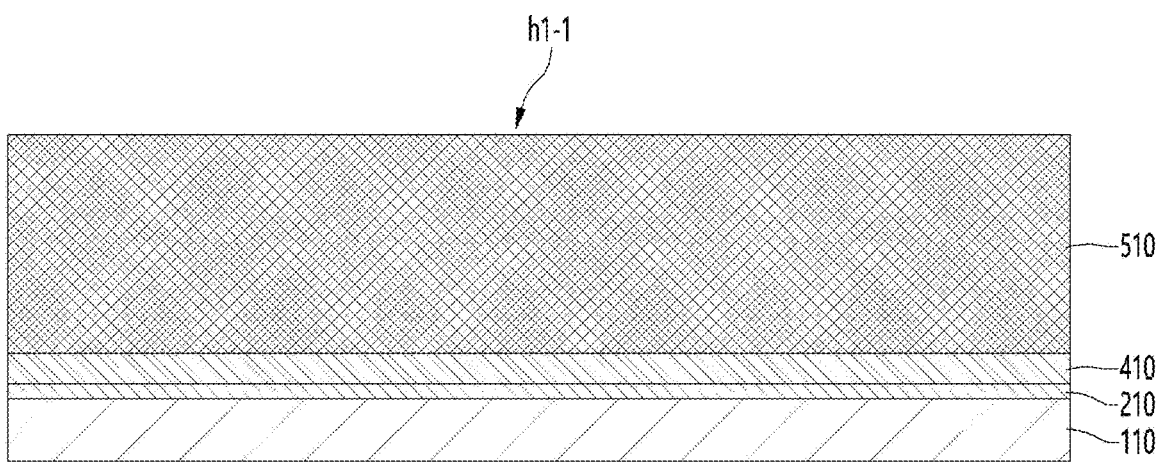
FIGS. 7 to 9 are cross-sectional views taken along line B-B' in FIG. 1.
Figure 9:
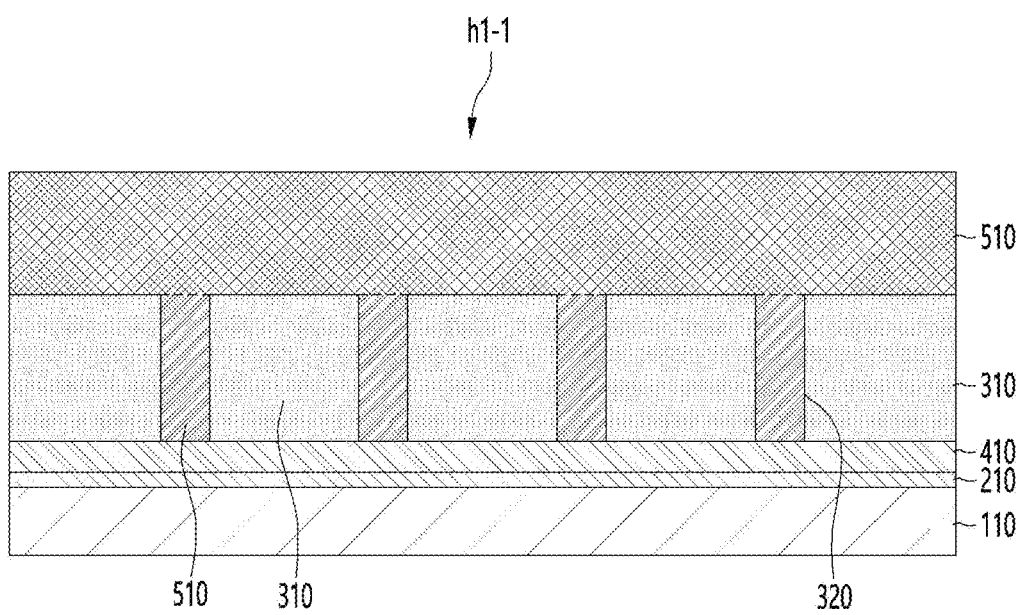

FIGS. 7 to 9 are cross-sectional views taken along line B-B' in FIG. 1. That is, FIGS. 7 to 9 are cross-sectional views taken both ends of one of the first sealing portions 510.

In detail, FIG. 7 is a cross-sectional view of the first sealing portion 510 in a region closest to one end of the light path control member in the second direction, and FIGS. 8 and 9 are cross-sectional views of the first sealing portion 510 in a region farther from one end of the light path control member in the second direction than in FIG. 7.

Referring to FIGS. 7 to 9, the first sealing portion 510 may be disposed inside the 1-1 cutting portion h1-1. The first sealing portion 510 may be disposed in contact with a side surface of the second substrate 120. In addition, the first sealing portion 510 may be disposed in contact with a side surface of the second electrode 220. In addition, the first sealing portion 510 may be disposed in contact with a side surface of the buffer layer 420. In addition, the first sealing portion 510 may be disposed in contact with a side surface of the base portion 350. In addition, the first sealing portion 510 may be disposed in contact with a side surface of the partition wall portion 310.

The 1-1 cutting portion h1-1 may be formed by removing one outer surface of the second substrate 120 in the first direction 1A and both outer surfaces of the second substrate 120 in the second direction 2A. Accordingly, in the one outer surface of the second substrate 120 in the first direction 1A, a portion of the 1-1 cutting portion h1-1 may be the outermost surface of the second substrate 120, and in a portion where the 1-1 cutting portion h1-1 1 among both outer surfaces of the second substrate 120 in the second direction 2A is formed, a portion of the 1-1 cutting portion h1-1 may be the outermost surface of the second substrate 120.

The first sealing portion 510 may be formed by disposing the sealing material inside the 1-1 cutting portion h1-1.

The sealing material of the first sealing portion 510 and the second sealing portion 520 may include the same material. Alternatively, the sealing material of the first sealing portion 510 and the second sealing portion 520 may include different materials.

As an example, a sealing material of at least one of the first sealing portion 510 and the second sealing portion 520 may include a photocurable material. In addition, a sealing material of at least one of the first sealing portion 510 and the second sealing portion 520 may include a material having low reactivity with the light conversion material. For example, a sealing material of at least one of the first sealing portion 510 and the second sealing portion 520 may include polyurethane acrylate.

The 1-1 cutting portion h1-1 may be formed to have a different depth for each region. In detail, a depth of the 1-1 cutting portion h1-1 may decrease as the 1-1 cutting portion h1-1 moves away from one end of the light path control member in the second direction.

In detail, referring to FIG. 1, the 1-1 cutting portion h1-1 may include a first region 1a and a second region 2a. In detail, the first region 1a may be defined from one end of the light path control member 1 in the second direction, which is one end of the 1-1 cutting portion h1-1, to a boundary region between the first region 1a and the second region 2a, and the second region 2a may be defined from the boundary region between the first region 1a and the second region 2a to the other end of the 1-1 cutting portion h1-1.

That is, the first region 1a may be disposed outside the second substrate 120, and the second region 2a may be disposed inside the second substrate 120.

The depth of the 1-1 cutting portion h1-1 in the first region 1a and the second region 2a may be different. That is, the 1-1 cutting portion h1-1 may include regions having different depths.

FIG. 7 is a cross-sectional view of the first region 1a.

Referring to FIG. 7, the first region 1a of the 1-1 cutting portion h1-1 may be formed to sequentially pass through the second substrate 120, the second electrode 220, the buffer layer 420, and the light conversion part 300 which is including the base portion 350 and the partition wall portion 310. Accordingly, in the first region 1a, the 1-1 cutting portion h1-1 may be disposed to expose the adhesive layer 410.

Accordingly, the first sealing portion 510 disposed in the first region 1a may be disposed in contact with the adhesive layer 410. In detail, the first sealing portion 510 may be disposed in contact with an upper surface of the adhesive layer 410, the side surface of the partition wall portion 310, and the side surface of the base portion 350.

FIGS. 8 and 9 are cross-sectional views of the second region 2*a*.

Referring to FIG. 8, the second region 2*a* of the 1-1 cutting portion h1-1 may be formed to pass through the second substrate 120. In addition, the second region 2*a* may be formed to pass through the second electrode 220 and the buffer layer 420.

Accordingly, in the second region 2*a*, the 1-1 cutting portion h1-1 may be disposed to expose an upper surface of the base portion 350.

Accordingly, the first sealing portion 510 disposed in the second region 2*a* may be disposed in contact with the upper surface of the base portion 350. In detail, the first sealing portion 510 may be disposed in contact with the upper surface of the base portion 350, a side surface of the buffer layer 410, the side surface of the second electrode 220, and the side surface of the second substrate 120.

Therefore, the 1-1 cutting portion h1-1 including the first region 1*a* and the second region 2*a* may be formed to expose the upper surface of the adhesive layer 410, the side surface of the partition wall 310, and the upper surface of the base portion 350.

Accordingly, the first sealing portion 510 disposed inside the 1-1 cutting portion h1-1 may be disposed in contact with the upper surface of the adhesive layer 410, an outer surface of the partition wall portion 310, and the upper surface of the base portion 350.

That is, since the 1-1 cutting portion h1-1 includes the first region 1*a* and the second region 2*a* having different depths, a contact area of the first sealing portion 510 may be increased compared to a case formed at the same depth.

Accordingly, as the contact area of the first sealing portion 510 disposed inside the 1-1 cutting portion h1-1 increases, the adhesive properties of the first sealing portion 510 may be improved.

Referring to FIG. 9, the second region 2*a* of the 1-1 cutting portion h1-1 may be formed to pass through the second substrate 120, the second electrode 220, the buffer layer 420, and the base portion 350.

Accordingly, the 1-1 cutting portion h1-1 may be disposed to expose an upper surface of the partition wall portion 310 in the second region 2*a*. That is, since one end of the partition wall portion 310 is disposed to protrude from one end of the second substrate 120, in the second region 2*a*, the upper surface and an inner surface of the partition wall portion 310, and an upper surface of the receiving portion 320 may be exposed.

That is, the partition wall portion 310 may be disposed to protrude more in the second direction than the end of the second substrate in the second direction, and the partition wall portion 310 may be exposed in the second region 2*a*.

Accordingly, the first sealing portion 510 disposed inside the 1-1 cutting portion h1-1 may be disposed in contact with the upper surface of the adhesive layer 410, the upper surface, the outer surface, and the inner surface of the partition wall portion 310, and a lower surface of the receiving portion. In detail, the first sealing portion 510 disposed inside the 1-1 cutting portion h1-1 may be disposed in contact with the upper surface, the outer surface, and the inner surface of the partition wall portion 310, the lower surface of the receiving portion, the side surface of the buffer layer 420, the side surface of the second electrode 220, and the side surface of the second substrate 120.

That is, since the 1-1 cutting portion h1-1 includes the first region 1*a* and the second region 2*a* having different depths, the contact area of the first sealing portion 510 may be increased compared to the case formed at the same depth.

Accordingly, as the contact area of the first sealing portion 510 disposed inside the 1-1 cutting portion h1-1 increases, the adhesive properties of the first sealing portion 510 may be improved.

In addition, when the light conversion material is injected into the receiving portion through the 1-1 cutting portion h1-1, the light conversion material may be easily injected through the second region 2*a*.

That is, the light conversion material may be injected into the receiving portion 320 through the 1-1 cutting portion h1-1 and the 1-2 cutting portion h1-2. For example, the 1-1 cutting portion h1-1 may be defined as an inlet into which the light conversion material is injected, and the 1-2 cutting portion h1-2 may be defined as an outlet through which the injected light conversion material is sucked and discharged.

In this case, when the light conversion material is injected into the receiving portion through the 1-1 cutting portion h1-1, the light conversion material may be moved into the receiving portion not only through a space between outer surfaces of the partition wall portions but also through a space between upper surfaces of the partition wall portions, and thus the light conversion material may be easily injected.

In particular, even when the 1-1 cutting portion h1-1 is formed or, after formation, external impurities are introduced into the cutting portion to block a region between the outer surfaces of the partition wall portions, the light conversion material may be injected into the receiving portion through the space between the upper surfaces of the partition wall portions.

Accordingly, the light conversion material may be easily injected into the receiving portion, and filling characteristics of the light conversion material may be improved.

The first sealing portion 510 may be disposed on the side surface of the light path control member, that is, a side surface in the first direction 1A, to seal the receiving portion 320 of the light conversion part 300. That is, while inhibiting the light conversion material 330 accommodated in the receiving portion 320 from flowing out to the outside, impurities that may penetrate from the outside may be inhibited from penetrating into the light conversion part 300.

The first sealing portion 510 may be disposed to completely fill the 1-1 cutting portion h1-1 or may be disposed to have a height lower than a depth of the 1-1 cutting portion h1-1. Accordingly, an upper surface of the first sealing portion 510 may be disposed to have a height lower than the upper surface of the second substrate 120. That is, a step may be formed between the upper surface of the first sealing portion 510 and the upper surface of the first substrate 110. In addition, the upper surface of the first sealing portion 510 may be formed in a concave shape.

Figure 10:
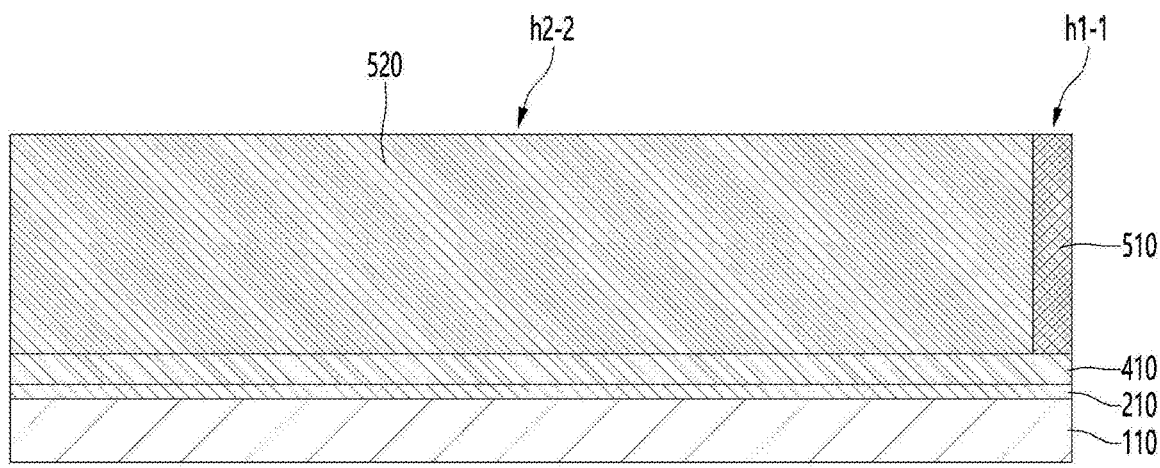
FIG. 10 is a cross-sectional view taken along line C-C' in FIG. 1.

FIG. 10 is a cross-sectional view taken along line C-C' in FIG. 1. That is, FIG. 10 is a cross-sectional view taken both ends of a sealing portion to which the first sealing portion 510 and the second sealing portion 520 are connected in the first direction.

Referring to FIG. 10, the 1-2 cutting portion h1-2 and the 2-1 cutting portion h2-1 may be connected to each other.

In addition, the 1-2 cutting portion h1-2 may be spaced apart from the 2-2 cutting portion h2-2. That is, one end of the 1-2 cutting portion h1-2 may be spaced apart from the 2-2 cutting portion h2-2.

The 1-2 cutting portion h1-2 and the 2-2 cutting portion h2-2 may be spaced apart from each other, whereby an open region OA formed between the 1-2 cutting portion h1-2 and the 2-2 cutting portion h2-2 may be formed.

The electrode connection portion 700 of the second connection region CA2 disposed on the second protrusion PA2 of the second substrate 120 through the second electrode 220 disposed in the open region OA and the second electrode 220 may be connected without being disconnected. That is, a current and a voltage transmitted through the open region OA may be applied to the light conversion material 330 inside the receiving portion 320 disposed between the first sealing portion 510 and the second sealing portion. Since the 1-2 cutting portion h1-2 and the 2-1 cutting portion h2-1 are connected, the first sealing portion 510 disposed on the 1-2 cutting portion h1-2 and the second sealing portion 520 disposed on the 2-1 cutting portion h2-1 may be disposed to be connected to each other. In addition, since the 1-2 cutting portion h1-2 and the 2-2 cutting portion h2-2 are spaced apart from each other, the first sealing portion disposed on the 1-2 cutting portion h1-2. 510 may be disposed to be spaced apart from the second sealing portion 520 disposed on the 2-2 cutting portion h2-2.

Meanwhile, in the drawing, it is illustrated that the 2-1 cutting portion h2-1 is disposed to be spaced apart from the end of the second substrate 120 in the first direction 1A, that is, the outer surface, but the embodiment is not limited thereto, and the 2-1 cutting portion h2-1 may be formed by removing one outer surface of the second substrate 120 in the first direction 1A like the 1-1 cutting portion h1-1 described above. Accordingly, in the one outer surface of the second substrate 120 in the first direction 1A, a portion of the 2-1 cutting portion h2-1 may be the outermost surface of the second substrate 120.

In addition, it is illustrated in FIG. 10 that only the first 1-1 cutting portion h1-1 is formed at a depth exposing the adhesive layer 410, the embodiment is not limited thereto, and as shown in FIGS. 8 and 9, it may be formed while exposing the upper surface of the base portion or the inner and upper surfaces of the partition wall portion.

Meanwhile, the 2-1 cutting portion h2-1 and the 2-2 cutting portion h2-2 may be disposed to have different lengths. In detail, a length of the 2-2 cutting portion h2-2 in the second direction 2A may be greater than a length of the 2-1 cutting portion h2-1 in the second direction 2A.

The 2-2 cutting portion h2-2 may be disposed to extend to the second protrusion PA2 of the second substrate 120, and accordingly, the 2-2 cutting portion h2-2 may be disposed. The length of may be disposed to be greater than that of the second-first cutting portion h2-1.

Accordingly, a length of the second sealing portion 520 disposed inside the 2-1 cutting portion h2-1 and the 2-2 cutting portion h2-2 may also vary. That is, a length of the second sealing portion 520 disposed inside the 2-2 cutting portion h2-2 may be greater than that of the second sealing portion 520 disposed in the 2-1 cutting portion h2-1.

A first sealing portion and a second sealing portion may be disposed inside the 1-1 cutting portion, the 1-2 cutting portion, the 2-1 cutting portion, and the 2-2 cutting portion, respectively.

The first sealing portion and the second sealing portion may be disposed to seal an inlet and an outlet of the receiving portion for accommodating the light conversion material and may be disposed to extend along a side surface region of the light conversion part, that is, a side surface region in the first direction.

Accordingly, it is possible to inhibit the light conversion material inside the receiving portion from flowing out to the outside of the light conversion part by the first sealing portion, and it is possible to inhibit impurities from penetrating into the light conversion part from the outside by the first sealing portion and the second sealing portion, thereby improving the reliability of the light path control member.

In addition, since the first sealing portion and the second sealing portion are disposed inside the cutting portions formed on the second substrate, as compared with the formation of the first sealing portion and the second sealing portion outside the light conversion part, the size of the light path control member may be reduced, and sealing characteristics of the light path control member may be improved by inhibiting the sealing portion material from being denatured by an external environment.

Figure 11:
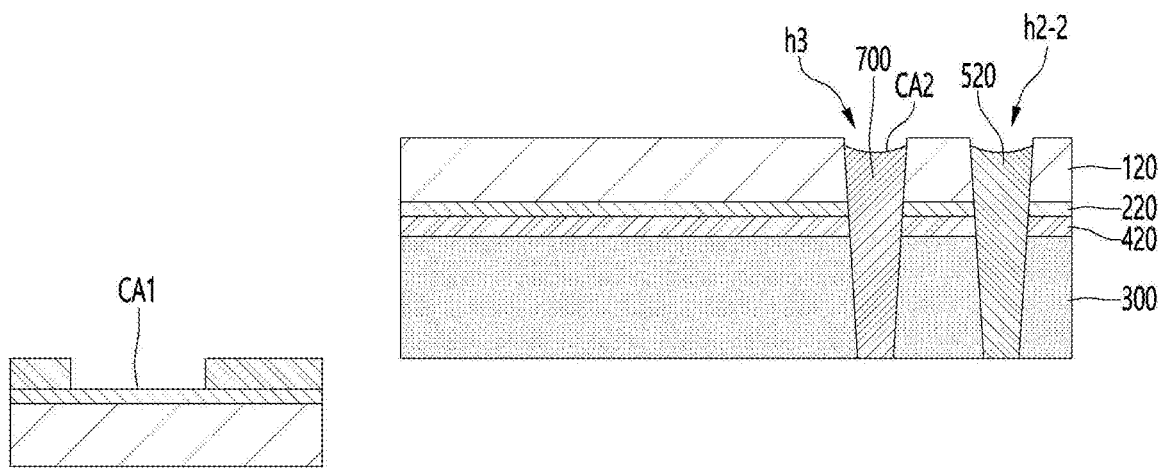
FIG. 11 is a cross-sectional view taken along line D-D' in FIG. 1.

FIG. 11 is a cross-sectional view taken along line D-D' in FIG. 1. That is, FIG. 11 is a cross-sectional view taken along a protrusion region of the first substrate and the second substrate.

Referring to FIG. 11, a first protrusion PA1 of the first substrate 110 and a second protrusion PA2 of the second substrate 120 may be disposed to be spaced apart from each other. That is, the first protrusion PA1 of the first substrate 110 and the second protrusion PA2 of the second substrate 120 may be disposed to be spaced apart from each other in the first direction 1A.

Accordingly, the first connection region CA1 disposed on the first protrusion PA1 and the second connection region CA2 disposed on the second protrusion PA2 are physically spaced apart from each other, so that it is possible to inhibit the first connection region CA1 and the second connection region CA2 from being electrically connected to each other through the adhesive layer.

The first connection region CA1 may be disposed on the first protrusion PAL. The first electrode 210 may be exposed in the first connection region CA1. That is, the first electrode 210 on the first substrate 110 may be exposed by partially removing the adhesive layer 410 on the first protrusion PA1, and accordingly, an upper surface of the first electrode 210 may be exposed in the first connection region CA1. That is, the first electrode 210 exposed in the first connection region CA1 may be a first connection electrode that is connected to an external printed circuit board or a flexible printed circuit board.

In addition, the second connection region CA2 may be disposed on the second protrusion PA2. A third cutting portion h3 may be formed in the second connection region CA2. An electrode connection portion 700 including a conductive material may be disposed inside the third cutting portion h3.

The electrode connection portion 700 may include a material different from that of at least one of the first electrode 210 and the second electrode 220. In addition, a light transmittance of the electrode connection portion 700 may be smaller than that of at least one of the first electrode 210 and the second electrode 220.

For example, the electrode connection portion 700 may include a metal. In detail, the electrode connection portion 700 may include a metal paste in which metal particles are dispersed in a binder.

The electrode connection portion 700 may be disposed in contact with a side surface of the second substrate 120. In addition, the electrode connection portion 700 may be disposed in contact with a side surface of the second electrode 220. In addition, the electrode connection portion 700 may be disposed in contact with a side surface of the buffer layer 420. In addition, the electrode connection portion 700 may be disposed in contact with a side surface of the base portion 350. In addition, the electrode connection portion 700 may be disposed in contact with a side surface of the partition wall portion 310.

That is, the electrode connection portion 700 may be disposed in contact with at least one side surface of the second substrate 120, the second electrode 220, the buffer layer 420, the base portion 350, and the partition wall portion 310.

An upper surface of the electrode connection portion 700 may be disposed on the same plane as the upper surface of the second substrate 120 or may be lower. For example, the upper surface of the electrode connection portion 700 may be disposed on the same plane as the upper surface of the second substrate 120. Alternatively, as shown in FIG. 8, the upper surface of the electrode connection portion 700 may be disposed lower than the upper surface of the second substrate 120.

Accordingly, the upper surface of the electrode connection portion 700 and the upper surface of the second substrate 120 may be formed on the same plane without a step, or may be disposed with a step such that the upper surface of the electrode connection portion 700 is lower.

Accordingly, it is possible to inhibit an overall thickness of the light path control member from increasing due to a height of the electrode connection portion 700, thereby reducing the overall thickness of the light path control member.

The electrode connection portion 700 may be electrically connected to the second electrode 220 and may be exposed to the outside of the second substrate 120. That is, the electrode connection portion 700 may be exposed on the second protrusion portion PA2 of the second substrate 120. That is, the upper surface of the electrode connection portion 700 may be exposed in the second connection region CA2.

Accordingly, the electrode connection portion 700 exposed in the second connection region CA2 may be a second connection electrode connected to an external printed circuit board or a flexible printed circuit board.

Accordingly, the first electrode 210 and the second electrode 220 may be respectively connected to the same printed circuit board or flexible printed circuit board through the first connection electrode of the first connection region and the second connection electrode of the second connection region to be electrically connected to each other.

Alternatively, the first electrode 210 and the second electrode 220 may be respectively connected to another printed circuit board or a flexible printed circuit board through the first connection electrode of the first connection region and the second connection electrode of the second connection region to be electrically connected to each other. That is, the first connection electrode may be connected to a first circuit board, and the second connection electrode may be connected to a second circuit board different from the first circuit board.

In the light path control member according to the first embodiment, the first connection electrode of the first connection region and the second connection electrode of the second connection region may be disposed on a first protrusion and a second protrusion formed on the first and second substrates.

The surfaces of the first and second substrates may not entirely protrude, and the first protrusion and the second protrusion may protrude only by an area in which the first connection region and the second connection electrode may be formed.

Accordingly, the areas of the first protrusion and the second protrusion may be reduced. Therefore, when the light path control member is coupled to a display panel and applied to a display device, other components of the display device may be disposed in regions that do not correspond to the first protrusion and the second protrusion, thereby reducing a bezel region of the display device.

That is, the light path control member according to the first embodiment reduces the size of the bezel region where the connection electrode is disposed, thereby reducing the bezel region of the display device to which the light path control member is applied.

Figure 12:
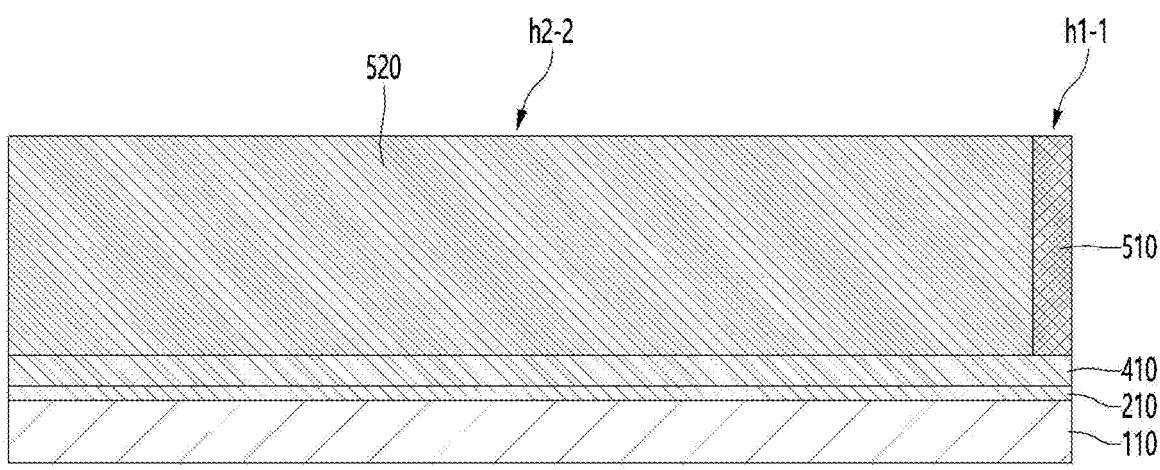
FIG. 12 is a cross-sectional view taken along line E-E' in FIG. 1.

FIG. 12 is a cross-sectional view taken along line E-E' in FIG. 1. That is, FIG. 12 is a cross-sectional view taken along both ends of the 2-2 cutting portion in the second direction.

Referring to FIG. 12, the 2-2 cutting portion h2-2 may be disposed to extend from the second protrusion PA2 of the second substrate 120 in the second direction 2A.

Referring to FIG. 12, the 1-1 cutting portion h1-1 and the 2-2 cutting portion h2-2 may be connected to each other.

Since the 1-1 cutting portion h1-1 and the 2-2 cutting portion h2-2 are connected, the first sealing portion 510 disposed in the 1-1 cutting portion h1-1 and the second sealing portion 520 disposed on the 2-2 cutting portion h2-2 may be disposed to be connected to each other.

Meanwhile, in the drawing, it is illustrated that the 2-2 cutting portion h2-2 is disposed to be spaced apart from the end of the second substrate 120 in the first direction 1A, that is, the outer surface, but the embodiment is not limited thereto, and the 2-2 cutting portion h2-2 may be formed by removing one outer surface of the second substrate 120 in the first direction 1A like the 1-1 cutting portion h1-1 described above. Accordingly, in the one outer surface of the second substrate 120 in the first direction 1A, a portion of the 2-2 second cutting portion h2-2 may be the outermost surface of the second substrate 120.

Figure 13:
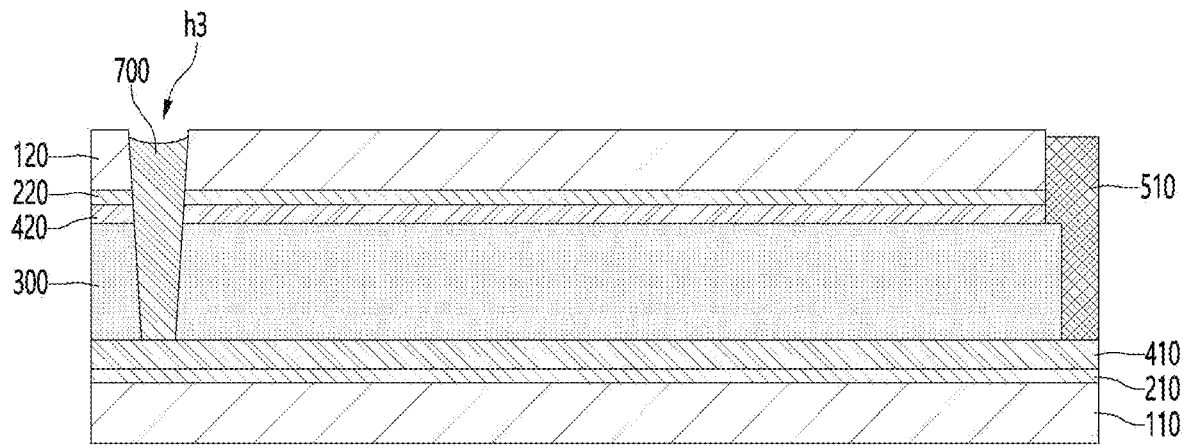
FIG. 13 is a cross-sectional view taken along line F-F' in FIG. 1.
Figure 14:
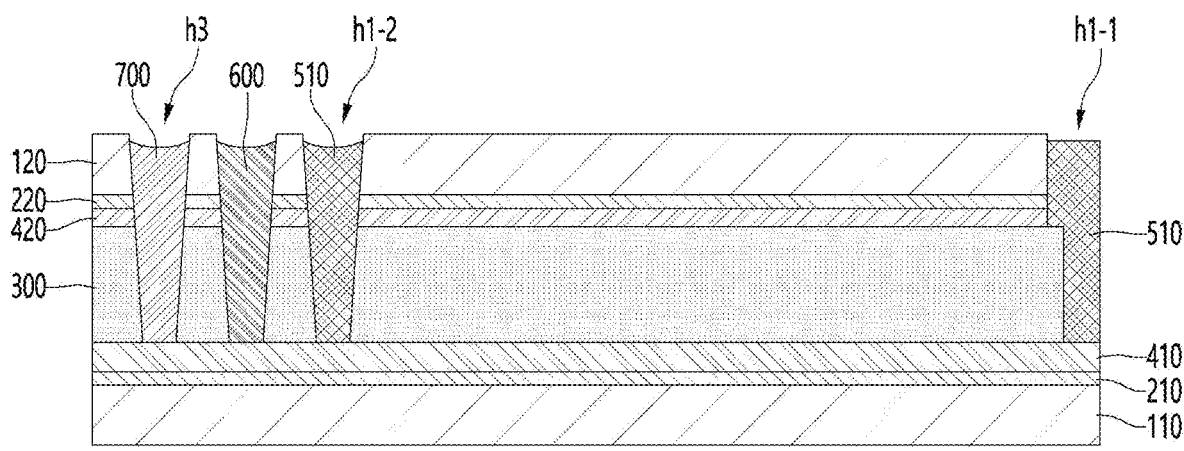
FIG. 14 is a cross-sectional view taken along line G-G' in FIG. 1.

FIG. 13 is a cross-sectional view taken along line F-F' in FIG. 1, and FIG. 14 is a cross-sectional view taken along line G-G' in FIG. 1, that is, FIGS. 13 and 14 are cross-sectional views taken the second connection region CA2 disposed on the second protrusion PA2 in the second direction.

Referring to FIGS. 13 and 14, the second connection region CA2 may include a region overlapping the first sealing portion 510 and a region not overlapping the first sealing portion 510.

That is, since the 1-2 cutting portion h1-2 and the 2-2 cutting portion h2-2 are disposed to be spaced apart from each other, the second connection region CA2 may be disposed in a region overlapping the open region OA in the second direction and in a region overlapping the first sealing portion 510 disposed inside the 1-2 cutting portion h1-2.

In addition, referring to FIGS. 13 and 14, the first sealing portion 510 disposed inside the 1-1 cutting portion h1-1 may be disposed in contact with the adhesive layer 410 and side and upper surfaces of the light conversion part.

In this case, the side and upper surfaces of the light conversion part may be the side surface of the partition wall portion and the upper surface of the base portion. Alternatively, the side and upper surfaces of the light conversion part may be the side surface of the partition wall portion and the upper surface of the partition wall portion.

The base portion of the light conversion part or the partition wall portion of the light conversion part may be disposed to protrude from the second substrate 120, the second electrode, and the buffer layer 420, and the first sealing portion 510 may be disposed in contact with the side surface of the partition wall portion and the upper surface of the base portion through the protrusion or may be disposed in contact with the side surface of the partition wall portion and the upper surface of the partition wall portion.

In addition, referring to FIG. 14, a dam portion 600 may be disposed between the second connection region CA2, that is, between the electrode connection portion 700 and the first sealing portion 510. That is, the dam portion 600 may be disposed on the second protrusion PA2 between the electrode connection portion 700 and the first sealing portion 510.

The dam portion 600 may be formed by filling a dam forming material in a cutting portion passing through the second substrate 120, the second electrode 220, the buffer layer 410, and the light conversion part 300.

The dam portion 600 is a material that controls an injection length of the light conversion material when the light conversion material 330 is injected into the receiving portion 320, and the dam portion 600 may inhibit the light conversion material 330 from overflowing in an outer direction of the dam, that is, in a direction of the electrode connection portion 700.

A part of the dam portion 600 may be removed during the manufacturing process of the light path control member, a part of the dam portion 600 may remain, and a part of the dam portion may remain in a region adjacent to the second connection region CA2.

Meanwhile, referring to FIG. 14, it is illustrated that the light conversion part 300 remains between the electrode connection portion 700 and the dam portion 600, but the embodiment is not limited thereto.

That is, when the light conversion part 300 between the electrode connection portion 700 and the dam portion 600 is a partition wall portion 310 region, as shown in FIG. 12, the light conversion part 300, the buffer layer 420, the second electrode 220, and the second substrate 120 may remain between the electrode connection portion 700 and the dam portion 600.

However, when the light conversion part 300 between the electrode connection portion 700 and the dam portion 600 is the receiving portion 320 region, a material of the dam portion 600 may move into the receiving portion 320, so that the dam portion 600 and the electrode connection portion 700 may contact each other.

In addition, referring to FIG. 14, it is illustrated that the light conversion part 300 remains between the dam portion 600 and the first sealing portion 510, but the embodiment is not limited thereto.

That is, when the light conversion part 300 between the dam portion 600 and the first sealing portion 510 is the receiving portion 320 region, the light conversion part 300, the buffer layer 420, the second electrode 220, and the second substrate 120 may remain between the dam portion 600 and the first sealing portion 510 as shown in FIG. 12.

However, when the light conversion part 300 between the dam portion 600 and the first sealing portion 510 is the receiving portion 320 region, materials of the first sealing portion 510 and the dam portion 600 may move into the receiving portion 320, so that the first sealing portion 510 and the dam portion 600 may contact each other.

Figure 15:
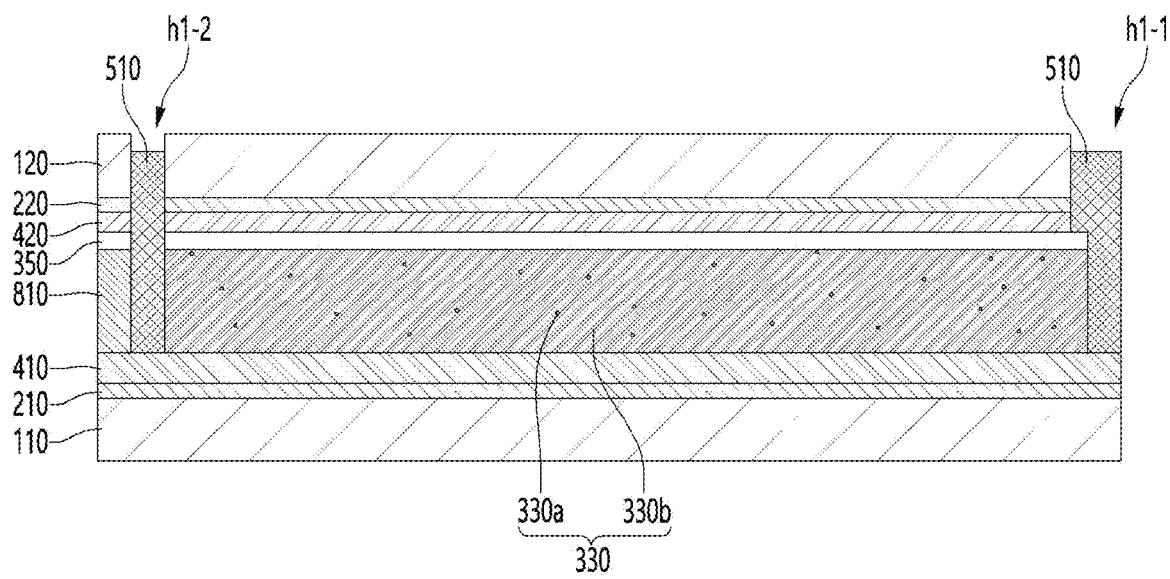
FIGS. 15 and 16 are cross-sectional views taken along line H-H' in FIG. 1.
Figure 16:
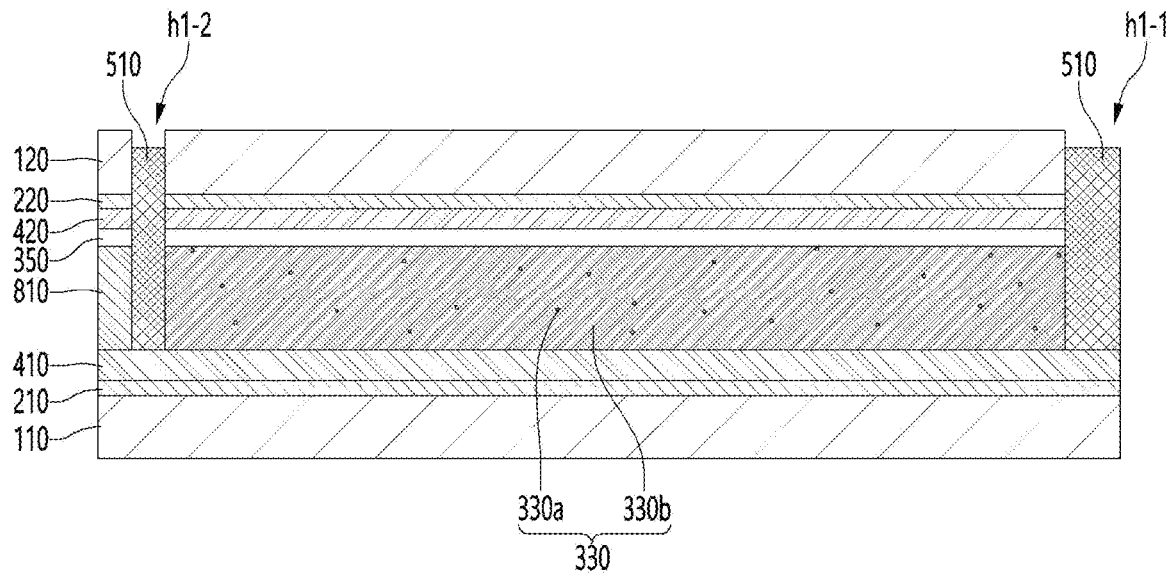

FIGS. 15 and 16 are cross-sectional views taken along line H-H' in FIG. 1. That is, FIGS. 15 and 16 are cross-sectional views taken one receiving portion of the light path control member in the second direction.

Referring to FIG. 15, a light conversion material 330 may be disposed inside the receiving portion 320. In detail, the light conversion material 330 and the first sealing portion 510 may be disposed inside the receiving portion 320.

The first sealing portion 510 may be disposed at one end and the other end of the receiving portion 320 in the second direction 2A to seal the light conversion material 330 disposed inside the receiving portion 320.

The light conversion material 330 inside the receiving portion 320 may be sealed by the first sealing portion 510, so that it is possible to inhibit the light conversion material 330 from flowing out to the outside of the light path control member.

The first sealing portion 510 disposed in the 1-1 cutting portion h1-1 may be disposed in contact with the optical conversion material 330.

Referring to FIG. 15, when the 1-1 cutting portion h1-1 is formed to pass through up to the buffer layer 420, the first sealing portion 510 disposed inside the 1-1 cutting portion h-1 may be disposed in contact with the side and upper surfaces of the base portion 350.

Alternatively, referring to FIG. 16, when the 1-1 cutting portion h1-1 is formed to pass through up to the base portion 350, the first sealing portion 510 disposed inside the 1-1 cutting portion h-1 may be disposed in contact with the side surface of the base portion 350 and the inner surface and the upper surface of the partition wall portion.

In addition, the first sealing portion 510 disposed in the 1-2 cutting portion h1-2 may be in contact with the light conversion material 330 and a first mixing region 810.

The first mixing region 810 may be a region where both the material of the dam portion 600 and a material of the first sealing portion 510, which are removed during the manufacturing process of the light path control member, are disposed.

That is, the first mixing region 810 may include the same or a different material from the first sealing portion 510.

For example, when the materials of the first sealing portion 510 and the dam portion 600 include the same material, the first mixing region 810 may be a region where the first sealing portion 510 extends.

Alternatively, when the materials of the first sealing portion 510 and the dam portion 600 include different materials, the first mixing region 810 may be a region where the materials of the first sealing portion 510 and the dam portion 600 are mixed or a region where the materials of the first sealing portion 510 and the dam portion 600 are separated while having an interface without being mixed with each other and disposed together.

By the first mixing region 810 disposed inside the receiving portion 320, it is possible to minimize the occurrence of air bubbles in the receiving portion 320.

That is, as an injection amount of the material of the dam portion 600 varies in any one of the receiving portions, a size of a space region between the first sealing portion 510 and the dam portion 600 may vary, and by disposing the sealing material of the first sealing portion 510 inside such a space region in an appropriate amount, the inside of the receiving portion may be disposed to fill with the first sealing portion 510, the light conversion material 330, and the like.

Accordingly, it is possible to inhibit the occurrence of air bubbles due to voids or the like inside the receiving portion 320 and a light leakage phenomenon or the like according thereto.

Figure 17:
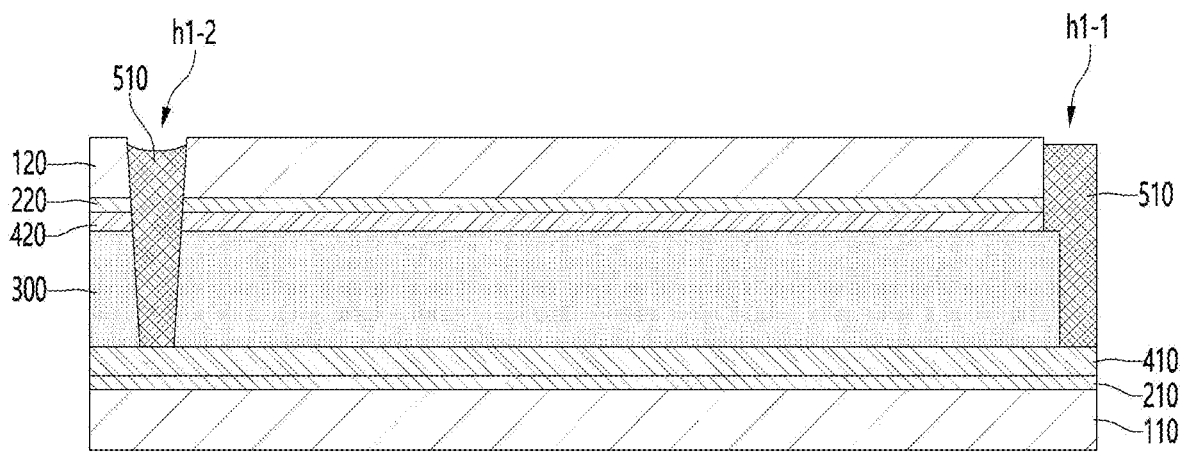
FIG. 17 is a cross-sectional view taken along line I-I' in FIG. 1.

FIG. 17 is a cross-sectional view taken along line I-I' in FIG. 1. That is, FIG. 17 is a cross-sectional view taken one partition wall portion of the light path control member in the second direction.

Referring to FIG. 17, the partition wall portion 310 may be disposed in a region corresponding to the partition wall portion 310, and the partition wall portion 310 may be entirely removed from the second substrate 120 to form the first sealing portion 510.

That is, the first sealing portion 510 may be disposed even in a region where the partition wall portion is disposed.

Accordingly, an area of the first sealing portion 510 may be increased by a size in which the partition wall portion is removed.

Therefore, an arrangement area of the first sealing portion 510 may be increased without increasing a thickness of the first sealing portion 510.

Accordingly, sealing characteristics of the light conversion material according to the first sealing portion 510 may be improved.

In the light path control member according to the first embodiment, a 1-1 cutting portion, a 1-2 cutting portion, a 2-1 cutting portion, and a 2-2 cutting portion that pass through the second substrate, the second electrode, the buffer layer, and an entire or a portion of the light conversion part on the second substrate may be formed.

In addition, a first sealing portion and a second sealing portion may be disposed inside the 1-1 cutting portion, the 1-2 cutting portion, the 2-1 cutting portion, and the 2-2 cutting portion, respectively.

The first sealing portion and the second sealing portion may be disposed to seal the inlet and the outlet of the receiving portion for accommodating the light conversion material and may be disposed to extend along a side region of the light conversion part, that is, a side region in the first direction.

Accordingly, it is possible to inhibit the light conversion material inside the receiving portion from flowing out to the outside of the light conversion part by the first sealing portion, and it is possible to inhibit impurities from penetrating into the light conversion part from the outside by the first sealing portion and the second sealing portion, thereby improving the reliability of the light path control member.

In addition, since the first sealing portion and the second sealing portion are disposed inside the cutting portions formed on the second substrate, as compared with the formation of the first sealing portion and the second sealing portion outside the light conversion part, the size of the light path control member may be reduced, and sealing characteristics of the light path control member may be improved by inhibiting the sealing portion material from being denatured by an external environment.

In addition, in the light path control member according to the first embodiment, the first connection electrode and the second connection electrode may be disposed on a first protrusion and a second protrusion formed on the first substrate and the second substrate.

The surfaces of the first and second substrates may not entirely protrude, and the first protrusion and the second protrusion may protrude only by an area in which the first connection region and the second connection electrode may be formed.

Accordingly, the areas of the first protrusion and the second protrusion may be reduced. Therefore, when the light path control member is coupled to a display panel and applied to a display device, other components of the display device may be disposed in regions that do not correspond to the first protrusion and the second protrusion, thereby reducing a bezel region of the display device.

That is, the light path control member according to the first embodiment reduces the size of the bezel region where the connection electrode is disposed, thereby reducing the bezel region of the display device to which the light path control member is applied.

In addition, in the light path control member according to the first embodiment, a depth of a cutting portion in which the first sealing portion is disposed may be different for each region.

Accordingly, since a contact area of the first sealing portion disposed inside the cutting portion may be increased, the adhesive properties of the first sealing portion may be improved, and accordingly, it is possible to inhibit the first sealing portion from being delaminated.

In addition, when the light conversion material is injected through the cutting portion before disposing the first sealing portion, a passage through which the light conversion material is moved into the receiving portion may be increased, thereby facilitating injection of the light conversion material.

Hereinafter, A light path control member according to a second embodiment will be described with reference to FIGS. 18 to 24.

In the description of the light path control member according to the second embodiment, descriptions of the same as or similar to those of the light path control member according to the first embodiment described above will be omitted, and the same reference numerals will be assigned to the same components.

Referring to FIGS. 18 to 24, in the light path control member according to the second embodiment, a receiving portion 320 of the light conversion part is tilted at a predetermined angle to be disposed unlike the first embodiment described above.

Referring to FIGS. 18 to 21, the receiving portion 320 may extend in a direction different from the first direction 1A and the second direction 2A.

Accordingly, one end and the other end of the at least one receiving portion among the receiving portions 320 may be in contact with the first sealing portion 510, and one end and the other end of the at least one receiving portion may be in contact with the first sealing portion 510 and the second sealing portion 520.

As the receiving portion is tilted at a predetermined inclination angle, and when the light path control member is coupled to a display panel to form a display device, it is possible to inhibit a moire phenomenon caused by overlapping the receiving portion of the light path control member and a pattern of the display panel.

That is, the one end and the other end of the receiving portion 320 according to the second embodiment may be formed on both an outer surface in the first direction and an outer surface in the second direction of the light path control member.

Figure 18:
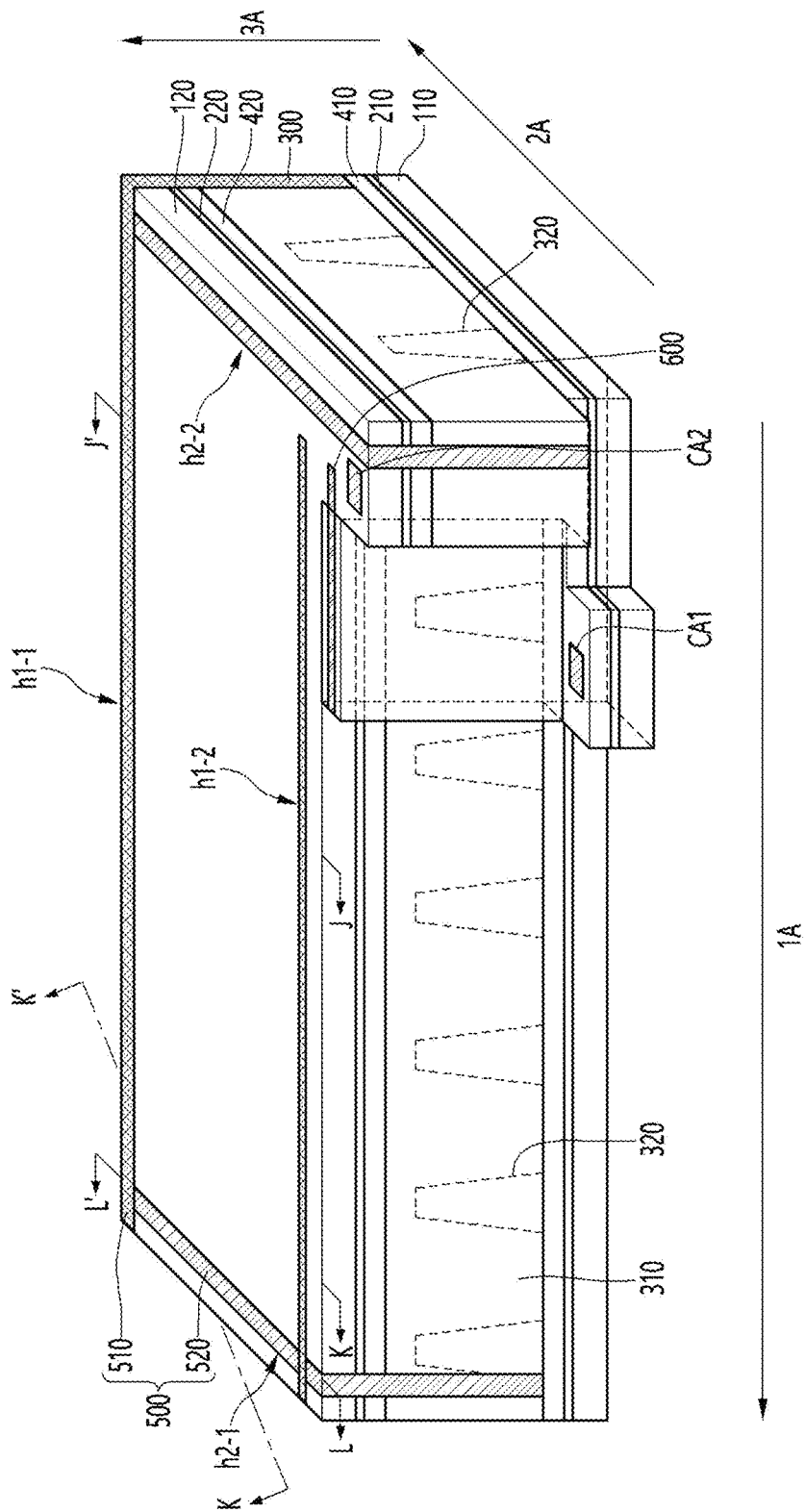
FIG. 18 is a perspective view of a light path control member according to a second embodiment.
Figure 19:
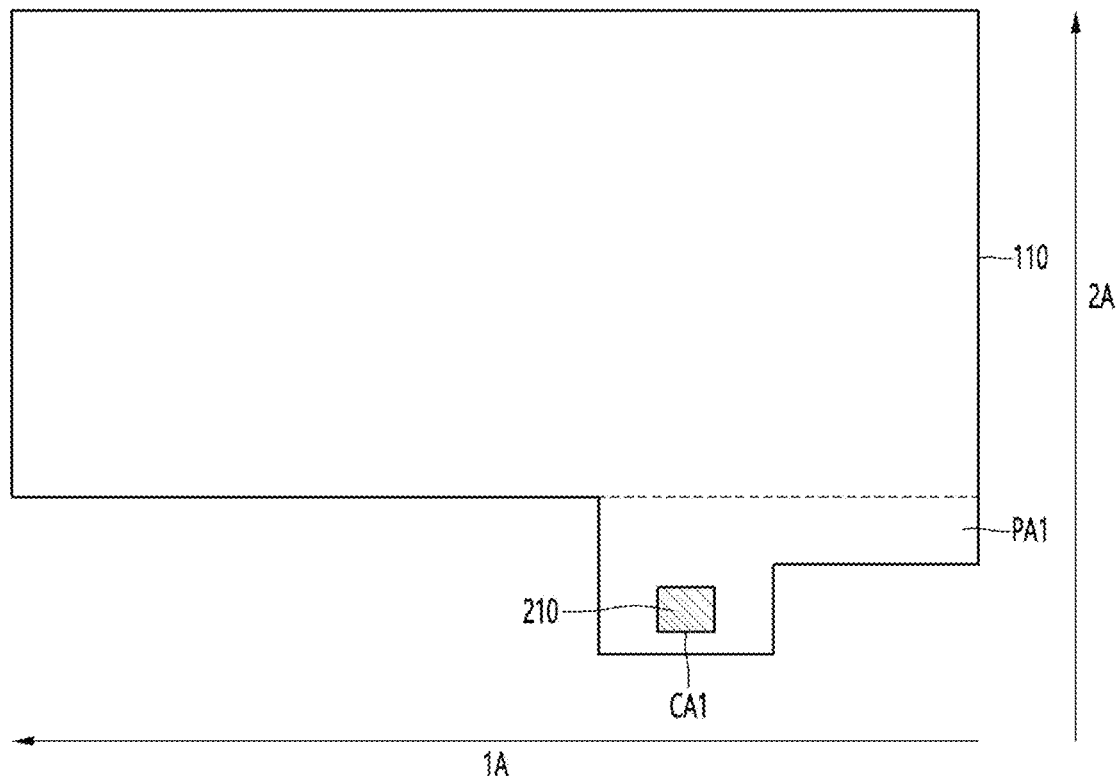
FIG. 19 is a top view of a first substrate of the light path control member according to the second embodiment.
Figure 20:
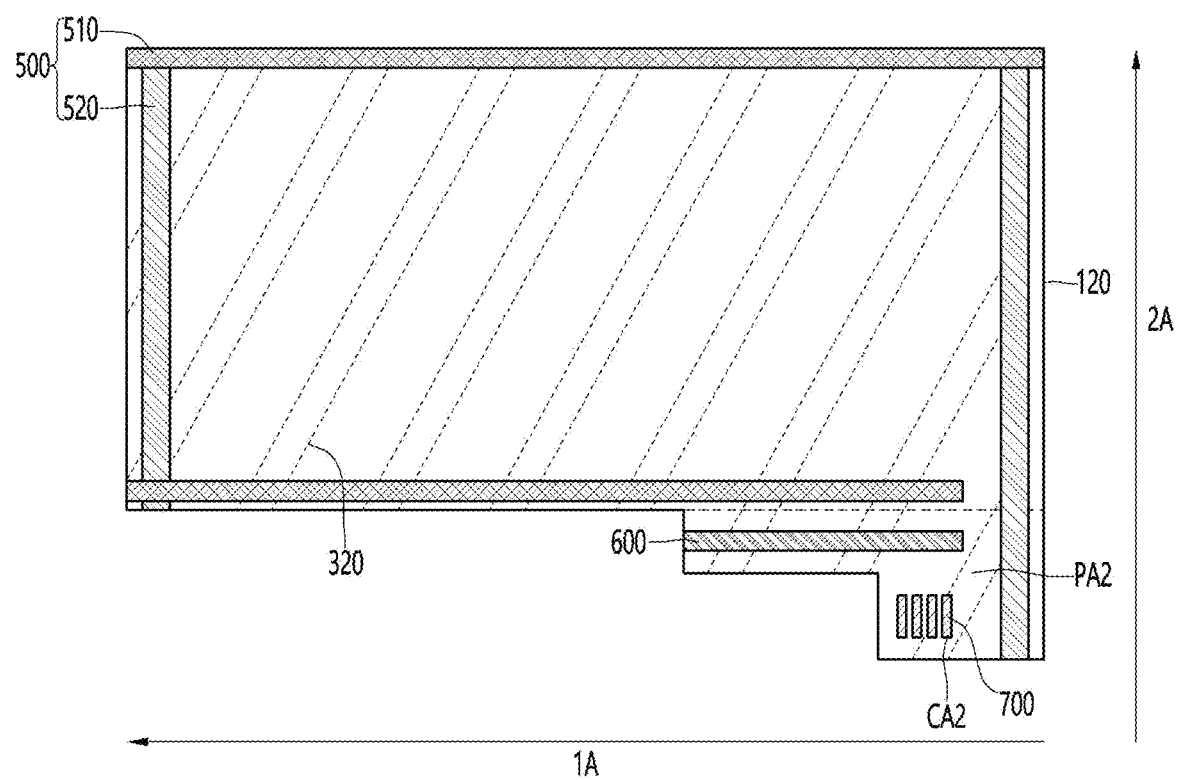
FIG. 20 is a top view of a second substrate of the light path control member according to the second embodiment.
Figure 21:
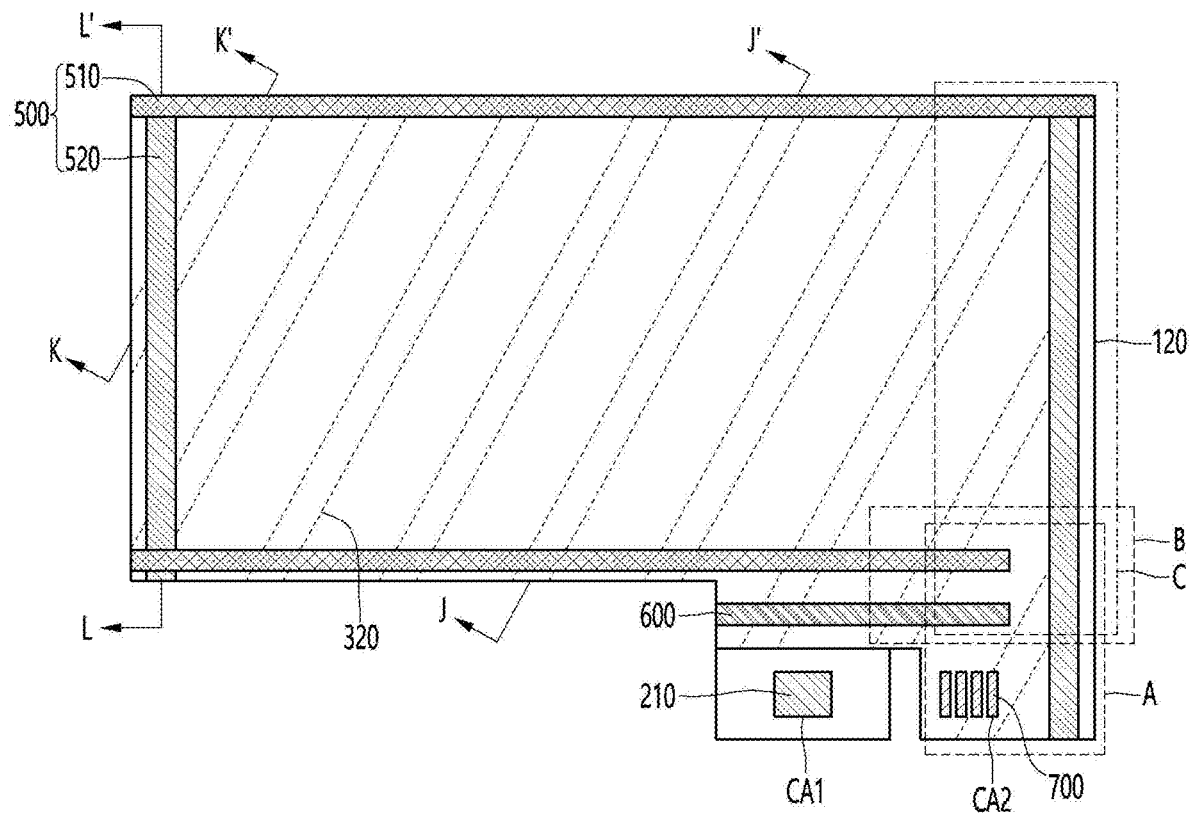
FIG. 21 is a top view of the second substrate in which the first and second substrates of the light path control member are laminated according to the second embodiment.
Figure 22:
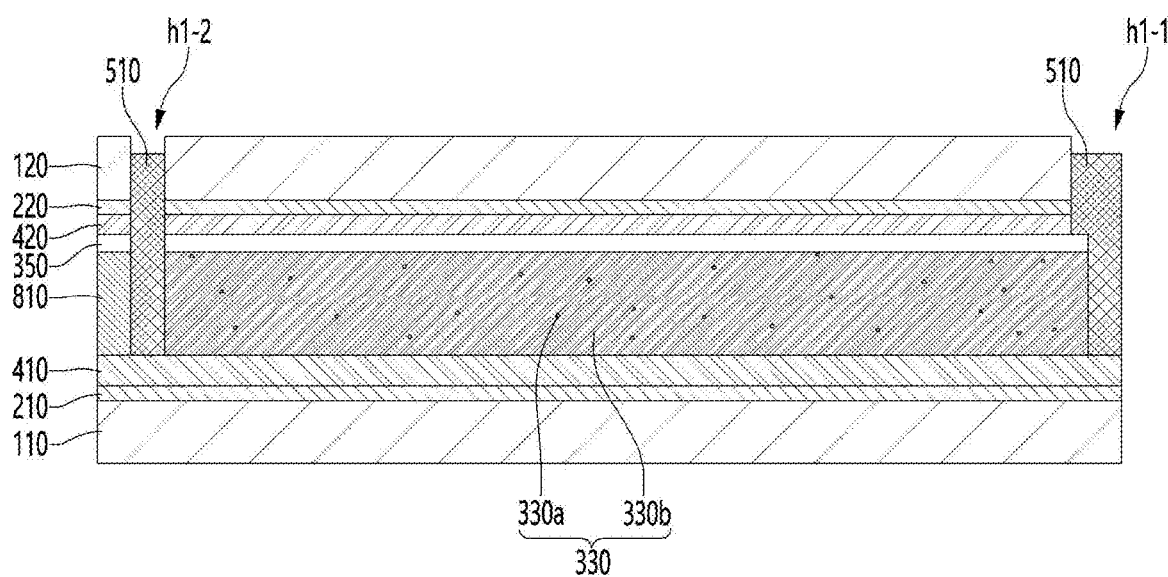
FIG. 22 is a cross-sectional view taken along line J-J' in FIG. 18.

FIG. 22 is a cross-sectional view taken along line J-J' in FIGS. 18 and 21. That is, FIG. 22 is a cross-sectional view taken one receiving portion of the light path control member in an inclination angle direction.

Referring to FIG. 22, a light conversion material 330 may be disposed inside the receiving portion 320. In detail, the light conversion material 330 and the first sealing portion 510 may be disposed inside the receiving portion 320.

The first sealing portion 510 may be disposed at one end and the other end of the receiving portion 320 in the second direction 2A to seal the light conversion material 330 disposed inside the receiving portion 320.

In addition, when the 1-1 cutting portion h1-1 is formed to pass through up to the buffer layer 420, the first sealing portion 510 disposed inside the 1-1 cutting portion h-1 may be disposed in contact with the side surface and the upper surface of the base portion 350.

That is, at least one receiving portion among the plurality of receiving portions of the light conversion part may be disposed in contact with only the first sealing portion 510.

The light conversion material 330 inside the receiving portion 320 may be sealed by the first sealing portion 510, so that it is possible to inhibit the light conversion material 330 from flowing out to the outside of the light path control member.

The first sealing portion 510 disposed in the 1-1 cutting portion h1-1 may be disposed in contact with the light conversion material 330. In addition, the first sealing portion 510 disposed in the 1-2 cutting portions h1-2 may be disposed in contact with the light conversion material 300 and a first mixing region 810.

The first mixing region 810 may be a region in which a material of the dam part 600 removed during the manufacturing process of the light path control member and a material of the first sealing part 510 are disposed to be mixed or separated.

That is, the first mixing region 810 may include the same or a different material from the first sealing portion 510.

For example, when the materials of the first sealing portion 510 and the dam portion 600 include the same material, the first mixing region 810 may be a region where the first sealing portion 510 extends.

Alternatively, when the materials of the first sealing portion 510 and the dam portion 600 include different materials, the first mixing region 810 may be a region where the materials of the first sealing portion 510 and the dam portion 600 are mixed or a region where the materials of the first sealing portion 510 and the dam portion 600 are separated while having an interface without being mixed with each other and disposed together.

By the first mixing region 810 disposed inside the receiving portion 320, it is possible to minimize the occurrence of air bubbles in the receiving portion 320.

That is, as an injection amount of the material of the dam portion 600 varies in any one of the receiving portions, a size of a space region between the first sealing portion 510 and the dam portion 600 may vary, and by disposing the sealing material of the first sealing portion 510 inside such a space region in an appropriate amount, the inside of the receiving portion may be disposed to fill with the first sealing portion 510, the light conversion material 330, and the like.

Accordingly, it is possible to inhibit the occurrence of air bubbles due to voids or the like inside the receiving portion 320 and the light leakage phenomenon or the like according thereto.

Figure 23:
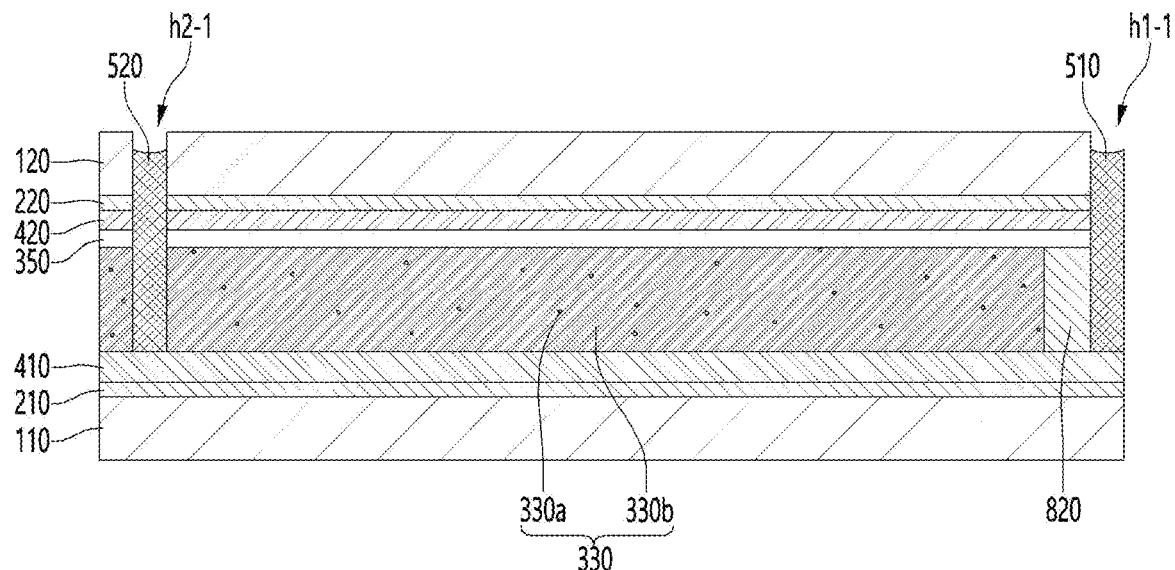
FIG. 23 is a cross-sectional view taken along line K-K' in FIG. 18.

FIG. 23 is a cross-sectional view taken along line K-K' in FIGS. 18 and 21. That is, FIG. 23 is a cross-sectional view taken the outermost receiving portion of the light path control member in an inclination angle direction.

Referring to FIG. 23, a light conversion material 330 may be disposed inside the receiving portion 320. In detail, the light conversion material 330 and the first sealing portion 510 and the second sealing portion 520 may be disposed inside the receiving portion 320.

The first sealing portion 510 and the second sealing portion 520 may seal the light conversion material 330 disposed inside the receiving portion 320.

That is, the first sealing portion 510 may seal an end in an outer surface direction in the second direction among ends of the receiving portion 320, and the second sealing portion 520 may seal an end in an outer surface direction in the first direction among the ends of the receiving portion 320.

That is, at least one receiving portion among the plurality of receiving portions of the light conversion part may be disposed in contact with the first sealing portion 510 and the second sealing portion 520.

The light conversion material 330 inside the receiving portion 320 is sealed by the first sealing portion 510 and the second sealing portion 520, so that it is possible to inhibit the light conversion material from flowing out to the outside.

The first sealing portion 510 disposed in the 1-1 cutting portion h1-1 may be disposed in contact with the light conversion material 330. Alternatively, the first sealing portion 510 disposed on the 1-1 cutting portion h1-1 may be in contact with the light conversion material 330 and a second mixing region 820.

The second mixing region 820 may be a region where both the first sealing portion 510 and the light conversion material 330 are included.

That is, in the first sealing portion 510 disposed in the 1-1 cutting portion h1-1, a part of the sealing material penetrates into the receiving portion 320 in a region overlapping the receiving portion 320, or, the light conversion material 330 may penetrate into the 1-1 cutting portion h1-1.

In the second mixing region 820, the light conversion material 330 and the sealing material may be disposed to be phase-separated from each other or may be disposed to be mixed with each other.

In addition, in the first sealing portion 510 disposed in the 1-1 cutting portion h1-1, a part of the sealing material penetrates into the receiving portion 320 in the region overlapping the receiving portion 320. The first sealing portion 510 may improve adhesive properties of the second sealing portion by an anchoring effect, and thus it is possible to inhibit the second sealing portion from being delaminated.

In addition, the second sealing portion 520 disposed in the 2-1 cutting portion h2-1 may be disposed in contact with the light conversion material 330. In detail, one surface of the second sealing portion 520 facing the first sealing portion may be in contact with the light conversion material 330. In addition, the light conversion material 330 may exist in a direction of the other surface opposite to the one surface to be in contact with the light conversion material 330. In addition, the second mixed region including both the light conversion material 330 and the sealing material may be disposed in the direction of the other surface opposite to the one surface.

Figure 24:
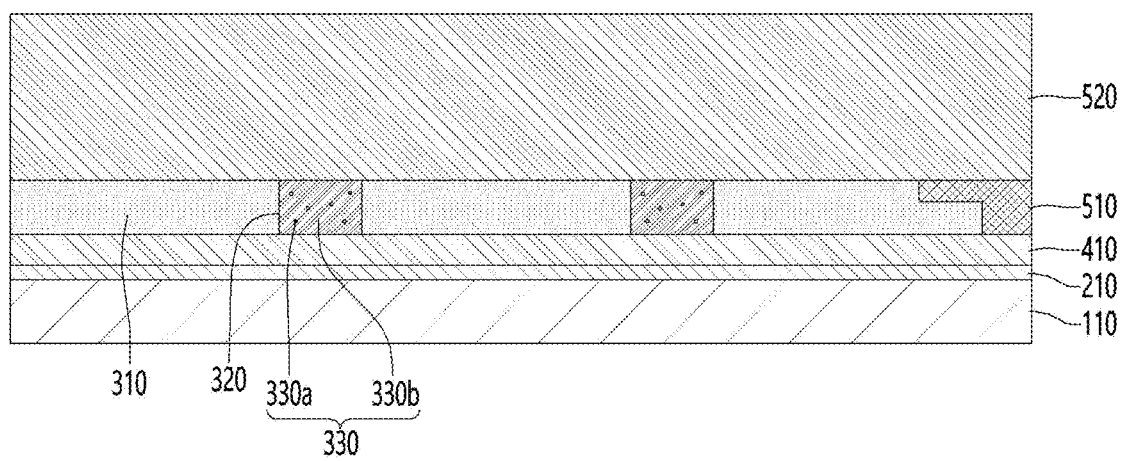
FIG. 24 is a cross-sectional view taken along line L-L' in FIG. 18.

FIG. 24 is a cross-sectional view taken along line L-L' in FIGS. 18 and 21. That is, FIG. 24 is a cross-sectional view taken along an extending direction of the second sealing portion of the light path control member.

Referring to FIG. 24, the second sealing portion 520 may be formed to pass through the second substrate 120, the second electrode 220, and the buffer layer 410 and may be formed by removing a part of the receiving portion 320 and the partition wall 310. In addition, the second sealing portion 520 may be formed to cross the receiving portion 320 and the partition wall portion 310. That is, the partition wall portion 310 and the receiving portion 320 may be alternately disposed under the second sealing portion 520.

Alight conversion material 330 may be disposed inside the receiving portion 320 that has not been removed. In detail, when the light conversion material 330 is filled in the receiving portion 320, one end of the light conversion material 330 inside the receiving portion 320 may be sealed by the first sealing portion 510 to minimize the movement of the light conversion material. Subsequently, the light conversion material remaining in the receiving portion under the second sealing portion may also be sealed by forming the 2-1 cutting portion h2-1 and forming the second sealing portion 520. That is, the second sealing portion 520 may be in contact with side and upper surfaces of the light conversion material 330 and may seal the light conversion material 330.

Preferably, when the second sealing portion is formed, both the receiving portion and the partition wall portion are removed, so that it is possible to inhibit the light conversion material from flowing out to the outside.

Meanwhile, a third mixing region may be formed in a region where the second sealing portion 520 and the receiving portion 320 overlap, that is, are in contact with each other.

The third mixing region may be a region where the second sealing portion 520 and the light conversion material 330 are mixed.

That is, in the second sealing portion 520 disposed in the 2-1 cutting portion h2-1, a part of the sealing material penetrates into the receiving portion 320 in the region overlapping the receiving portion 320, or the light conversion material may penetrate into the 2-1 cutting portion h2-1 to be mixed with the light conversion material 330.

Accordingly, the second sealing portion 520 may improve the adhesive properties of the second sealing portion by the anchor effect, and thus it is possible to inhibit the second sealing portion from being delaminated.

Meanwhile, the above-described light conversion material 330 may adjust the viscosity of the dispersion 330b in which the light conversion particles are dispersed in order to improve the mobility of the light conversion particles 330a.

In detail, in the above-described light path control member, the switching between the first mode and the second mode may be implemented by movement of the light conversion particles 330a dispersed inside the dispersion 330b. In addition, when a moving speed of the light conversion particle 330a increases, a switching speed to the first mode and the second mode also increases, so that a driving speed of the light path control member may be improved.

The moving speed of the light conversion particle 330a inside the receiving portion may be calculated by an electrophoretic mobility (E) and a response time ($t_{switching}$).

The electrophoretic mobility (E) and the response time ($t_{switching}$) according to the movement of the light conversion particle 330a in the receiving portion may be defined by the following equations.

$$t_{switching} = \frac{d}{\mu_E * E} = \frac{d^2}{\mu_E * V} \quad \text{[Equation 1]}$$

$$\text{Electrophoretic mobility } (\mu_E) = \frac{\text{Terminal velocity}}{\text{Applied electric field } (E)} \quad \text{[Equation 2]}$$

$$E = \frac{\text{Voltage (V)}}{\text{Distance between electrodes } (d)} \quad \text{[Equation 3]}$$

Here, as the response time ($t_{switching}$) increases, the driving speed of the light path control member may decrease, and as the response time ($t_{switching}$) decreases, the driving speed of the light path control member may increase.

Referring to the above equations, it can be seen that the electrophoretic mobility (E) is proportional to a dielectric constant (E) and is inversely proportional to a viscosity (i).

That is, as the dielectric constant of the light path control member increases, the mobility of the light conversion particles 330a increases, and as the viscosity decreases, the mobility of the light conversion particles 330a increases.

In addition, it can be seen that the response time ($t_{switching}$) related to the driving speed of the light path control member decreases as the electrophoretic mobility increases, a voltage increases, and a distance between electrodes decreases.

In conclusion, the response time ($t_{switching}$) related to the driving speed of the light path control member decreases as the viscosity of the dispersion 330b decreases and the dielectric constant increases, and as the response time decreases, the driving speed of the light path control member may be improved.

That is, it can be seen that the driving speed of the light path control member is inversely proportional to a viscosity ($\mu$) of the light conversion material 330, that is, a viscosity ($\mu$) of the dispersion 330b.

That is, when the viscosity ($\mu$) of the dispersion 330b increases, the response time increases, so that the driving speed of the light path control member decreases, and when the viscosity ($\mu$) of the dispersion 330b decreases, the response time decreases, so that the driving speed of the light path control member may be increased.

Accordingly, the light path control member according to the embodiment may control a material of the dispersion in order to increase the driving speed of the light path control member.

In detail, the dispersion 330b may include a material having a carbon number within a specific range. In detail, the dispersion 330b may include a material having a carbon number of 2 to 13.

For example, the dispersion 330b may include at least one of Isopar C, Isopar E, Isopar G, Isopar H, Isopar K, and Isopar L.

When the carbon number of the dispersion 330b is less than 2, it may be difficult to maintain the dispersion 330b in a liquid state, and thus it may be difficult to use the dispersion 330b as the light conversion material for the light path control member. In addition, when the carbon number of the dispersion 330b exceeds 13, the viscosity of the dispersion 330b increases, and accordingly, the driving speed of the light path control member may be decreased due to an increase in response time.

In detail, the dispersion 330b may have a low viscosity in a range of 0.5 cP to 3 cP in a range of the carbon number of 2 to 13.

Accordingly, as the light path control member including the dispersion 330b includes the low-viscosity dispersion, the electrophoretic mobility of the light path control member is increased and the response time is reduced, thereby improving the overall driving speed thereof.

In addition, since the dispersion 330b has a low viscosity, the fluidity of the dispersion is increased, when the receiving portion 320 is filled with a dispersion including the dispersion 330b, a filling speed may be improved, thereby improving process efficiency.

Meanwhile, the light path controlling member according to the embodiment may include a dispersion including two or more materials.

In detail, the light path control member may include a first solvent having the carbon number in the range of 2 to 13 described above and a second solvent having a dielectric constant (F/m) of 5 to 10.

In addition, the first solvent and the second solvent may have different viscosities. In detail, a viscosity of the first solvent may be smaller than that of the second solvent. In more detail, the viscosity of the first solvent may be 0.5 cP to 5 cP. In addition, the viscosity of the second solvent may be 1 cP to 30 cP.

A difference in viscosity between the first solvent and the second solvent may be 0.5 cP to 29 cP within the above range.

In detail, the second solvent may be included in an amount of 1 wt % to 10 wt % with respect to a total amount of the dispersion. When the second solvent is included in an amount of less than 1 wt % with respect to the total amount of the dispersion, it is difficult for an increase in electrophoretic mobility according to a high dielectric constant to implement, and when the second solvent exceeds 10 wt % with respect to the total amount of the dispersion, the viscosity of the dispersion is increased and the response time is increased, so that the driving speed of the light path control member may be decreased.

Hereinafter, the present invention will be described in more detail through the measurement of electrophoretic mobility according to the viscosity of the dispersion of the light path control member according to Examples and Comparative Examples. These examples are merely illustrative in order to describe the present invention in more detail. Therefore, the present invention is not limited to these examples.

Here, the measurement of the electrophoretic mobility was measured as a time taken for the light transmittance of the receiving portion from 10% to 35%, after a voltage was applied to the light path control member.

Example 1

The light path control member described above was manufactured.

In this case, the viscosity of the dispersion of the light conversion material disposed inside the receiving portion was 1.4 cP.

Then, after applying a voltage to the light path control member, the time taken for the light transmittance of the receiving portion from 10% to 35% was measured.

Example 2

A light path control member was manufactured in the same manner as in Example 1, except that the viscosity of the dispersion was set to 2.4 cP.

Then, after applying a voltage to the light path control member, the time taken for the light transmittance of the receiving portion from 10% to 35% was measured.

Comparative Example 1

A light path control member was manufactured in the same manner as in Example 1, except that the viscosity of the dispersion was 3.2 cP.

Then, after applying a voltage to the light path control member, the time taken for the light transmittance of the receiving portion from 10% to 35% was measured.

TABLE 1

|  | Example 1 | Example 2 | Comparative Example 1 |
|---|---|---|---|
| Arrival time (s) | 1.9 | 3.7 | 6 |

Figure 25:
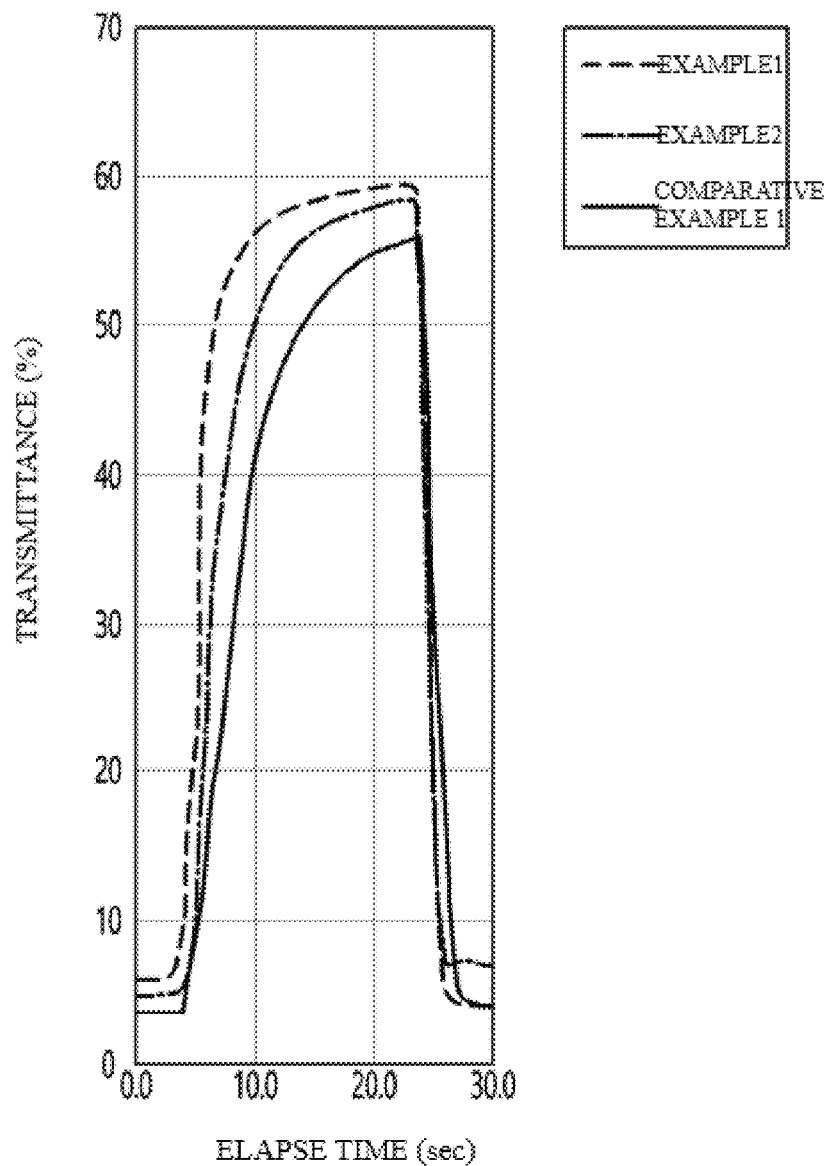
FIG. 25 is a view for describing a driving speed according to a viscosity of a dispersion of a light path control member according to an embodiment.

Referring to Table 1 and FIG. 25, it can be seen that the time taken for the light transmittance of the receiving portion from 10% to 35% in the light path control member according to Examples 1 and 2 is smaller than that of the light path control member according to Comparative Example 1.

That is, since viscosities of the dispersion in the light path control member according to Examples 1 and 2 is smaller than the viscosity of the dispersion in the light path control member according to Comparative Example 1, the electrophoretic mobility is increased to increase the moving speed of the light conversion particles, and accordingly, it can be seen that a conversion speed of the light transmittance is increased.

Measurement of Viscosity of Dispersion According to Carbon Number

A dispersion for manufacturing the light path control member described above was prepared.

Then, a viscosity of the dispersion according to a carbon number of the dispersion material was measured.

TABLE 2

|  | Carbon number | Average carbon number | Viscosity |
|---|---|---|---|
| Example 3 | 7~10 | 9 | 0.69 |
| Example 4 | 7~10 | 9 | 0.82 |
| Example 5 | 10~12 | 11 | 1.47 |
| Example 6 | 11~12 | 12 | 1.80 |
| Example 7 | 11~13 | 12 | 1.86 |
| Example 8 | 11~13 | 12 | 2.11 |
| Comparative Example 2 | 14~19 | 17 | 13.26 |

Referring to Table 2, dispersions of Examples 3 to 8 include a material having a carbon number smaller than that of a dispersion of Comparative Example 2.

In addition, it can be seen that the dispersions of Examples 3 to 8 have a viscosity lower than that of the dispersion of Comparative Example 2.

That is, it can be seen that the light path control member including the dispersions of Examples 3 to 8 has a viscosity lower than that of the light path control member including the dispersion of Comparative Example 2, thereby improving the driving speed of the light path control member.

Example 9

The light path control member described above was manufactured.

In this case, the dispersion of the light conversion material disposed inside the receiving portion included the first solvent and the second solvent.

In this case, the first solvent included a material having a viscosity of 0.5 cP to 5 cp, and the second solvent included a material having a viscosity higher than that of the first solvent.

In detail, the second solvent included a material having a viscosity higher by 0.5 cP to 29 cP than that of the first solvent.

In this case, the second solvent was included in an amount of 3 wt % with respect to the total amount of the dispersion.

Then, the viscosity of the dispersion was measured.

Example 10

A light path controlling member was prepared in the same manner as in Example 9, except that the second solvent was included in an amount of 5 wt % with respect to the total amount of the dispersion.

Then, the viscosity of the dispersion was measured.

Example 11

A light path controlling member was prepared in the same manner as in Example 9, except that the second solvent was included in an amount of 9 wt % with respect to the total amount of the dispersion.

Then, the viscosity of the dispersion was measured.

Comparative Example 3

A light path control member was prepared in the same manner as in Example 9, except that the second solvent was included in an amount of 20 wt % with respect to the total amount of the dispersion.

Then, the viscosity of the dispersion was measured.

Comparative Example 4

Alight path controlling member was prepared in the same manner as in Example 9, except that the second solvent was included in an amount of 80 wt % with respect to the total amount of the dispersion.

Then, the viscosity of the dispersion was measured.

Comparative Example 5

A light path control member was prepared in the same manner as in Example 9, except that the second solvent was included in an amount of 100 wt % with respect to the total amount of the dispersion, that is, the dispersion included only the second solvent.

Then, the viscosity of the dispersion was measured.

Figure 26:
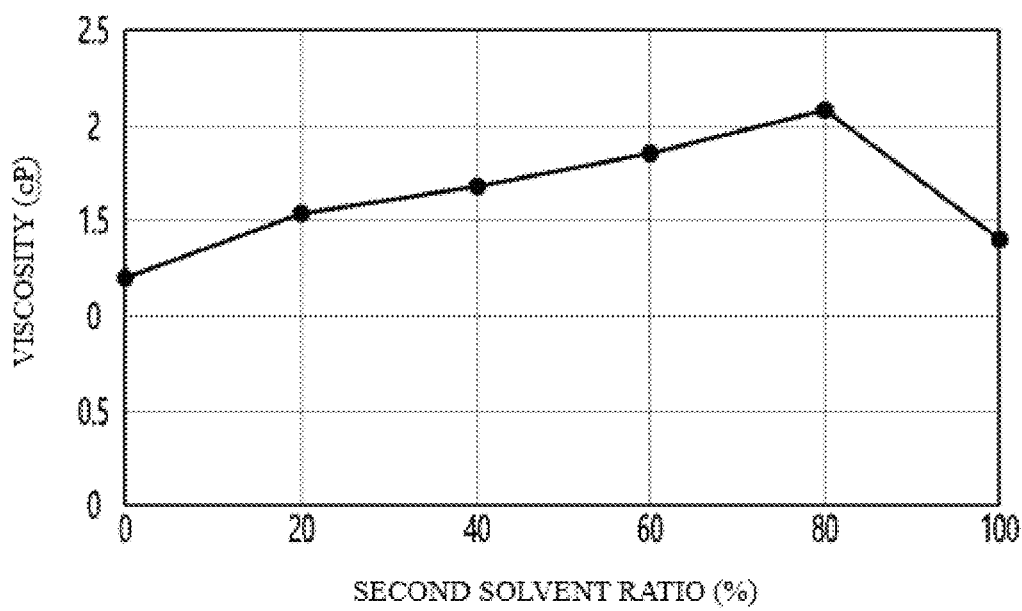
FIG. 26 is a view for describing the viscosity of the dispersion according to the mixing of the dispersion of the light path control member according to the embodiment.

Referring to FIG. 26, it can be seen that the dispersion of the light path controlling member according to Examples 9 to 11 has a viscosity lower than that of the dispersion of the light path controlling member according to Comparative Examples 3 to 5.

That is, it can be seen that the dispersion of the light path controlling member according to Examples 9 to 11 has a viscosity lower than that of the dispersion in Comparative Example 5, that is, when only the second solvent including only a solvent with high dielectric constant is used as the dispersion.

Accordingly, in the light path control member according to Examples 9 to 11, as the dielectric constant of the dispersion increases, the viscosity may also decrease, and thus the electrophoretic mobility inside the receiving portion of the light path control member is increased, and accordingly, the overall driving speed of the light path control member may be improved.

Hereinafter, referring to FIGS. 27 to 31, a display device to which a light path control member according to an embodiment is applied will be described.

Figure 27:
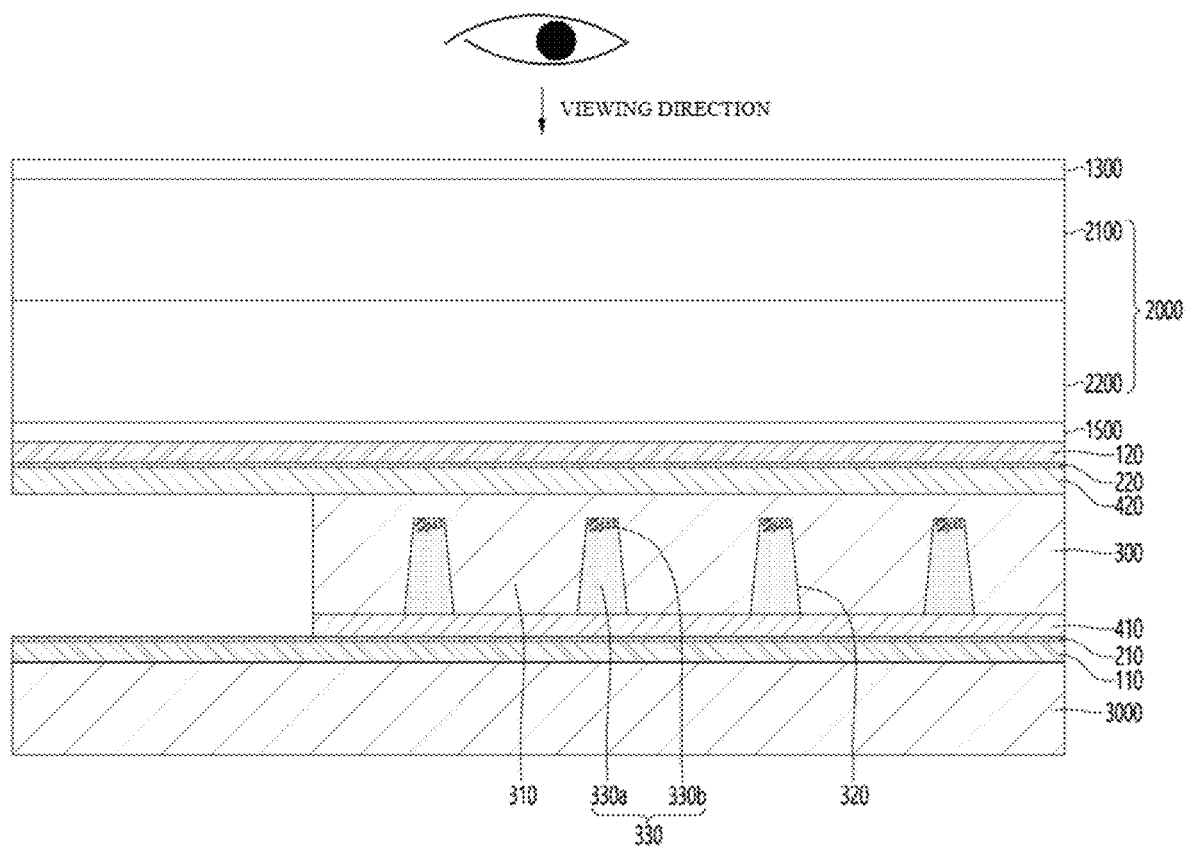
FIGS. 27 and 28 are cross-sectional views of a display device to which a light path control member according to an embodiment is applied.
Figure 28:
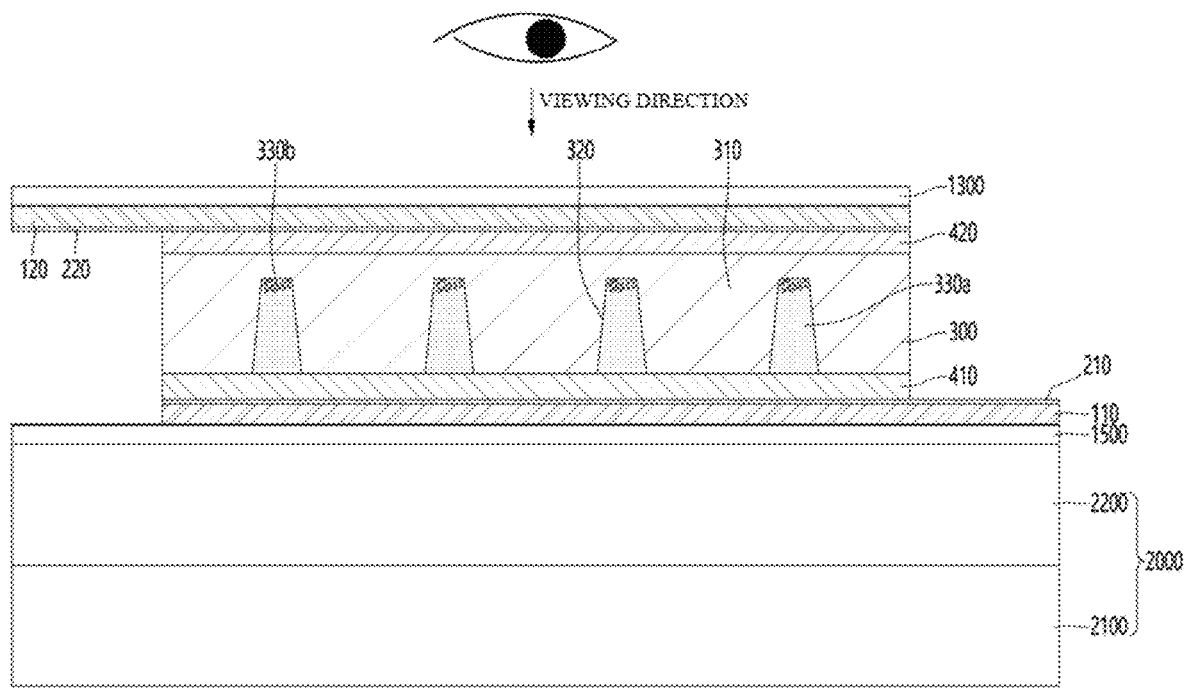

Referring to FIGS. 27 to 28, a light path control member 1000 according to an embodiment may be disposed on or under a display panel 2000.

The display panel 2000 and the light path control member 1000 may be disposed to be adhered to each other. For example, the display panel 2000 and the light path control member 1000 may be adhered to each other via an adhesive layer 1500. The adhesive layer 1500 may be transparent. For example, the adhesive layer 1500 may include an adhesive or an adhesive layer including an optical transparent adhesive material.

The adhesive layer 1500 may include a release film. In detail, when adhering the light path control member and the display panel, the light path control member and the display panel may be adhered after the release film is removed.

The display panel 2000 may include a first' substrate 2100 and a second' substrate 2200. When the display panel 2000 is a liquid crystal display panel, the light path control member may be formed under the liquid crystal panel. That is, when a surface viewed by the user in the liquid crystal panel is defined as an upper portion of the liquid crystal panel, the light path control member may be disposed under the liquid crystal panel. The display panel 2000 may be formed in a structure in which the first' substrate 2100 including a thin film transistor (TFT) and a pixel electrode and the second' substrate 2200 including color filter layers are bonded to each other with a liquid crystal layer interposed therebetween.

In addition, the display panel 2000 may be a liquid crystal display panel of a color filter on transistor (COT) structure in which a thin film transistor, a color filter, and a black electrolyte are formed at the first' substrate 2100 and the second' substrate 2200 is bonded to the first' substrate 2100 with the liquid crystal layer interposed therebetween. That is, a thin film transistor may be formed on the first' substrate 2100, a protective film may be formed on the thin film transistor, and a color filter layer may be formed on the protective film. In addition, a pixel electrode in contact with the thin film transistor may be formed on the first' substrate 2100. At this point, in order to improve an aperture ratio and simplify a masking process, the black electrolyte may be omitted, and a common electrode may be formed to function as the black electrolyte.

In addition, when the display panel 2000 is the liquid crystal display panel, the display device may further include a backlight unit 3000 providing light from a rear surface of the display panel 2000.

That is, as shown in FIG. 27, the light path control member may be disposed under the liquid crystal panel and on the backlight unit 3000, and the light path control member may be disposed between the backlight unit 3000 and the display panel 2000.

Alternatively, as shown in FIG. 28, when the display panel 2000 is an organic light emitting diode panel, the light path control member may be formed on the organic light emitting diode panel. That is, when the surface viewed by the user in the organic light emitting diode panel is defined as an upper portion of the organic light emitting diode panel, the light path control member may be disposed on the organic light emitting diode panel. The display panel 2000 may include a self-luminous element that does not require a separate light source. In the display panel 2000, a thin film transistor may be formed on the first' substrate 2100, and an organic light emitting element in contact with the thin film transistor may be formed. The organic light emitting element may include an anode, a cathode, and an organic light emitting layer formed between the anode and the cathode. In addition, the second' substrate 2200 configured to function as an encapsulation substrate for encapsulation may be further included on the organic light emitting element.

In addition, although not shown in drawings, a polarizing plate may be further disposed between the light path control member 1000 and the display panel 2000. The polarizing plate may be a linear polarizing plate or an external light reflection preventive polarizing plate. For example, when the display panel 2000 is a liquid crystal display panel, the polarizing plate may be the linear polarizing plate. Further, when the display panel 2000 is the organic light emitting diode panel, the polarizing plate may be the external light reflection inhibiting polarizing plate.

In addition, an additional functional layer 1300 such as an anti-reflection layer, an anti-glare, or the like may be further disposed on the light path control member 1000. Specifically, the functional layer 1300 may be adhered to one surface of the first substrate 110 of the light path control member. Although not shown in drawings, the functional layer 1300 may be adhered to the first substrate 110 of the light path control member via an adhesive layer. In addition, a release film for protecting the functional layer may be further disposed on the functional layer 1300.

Further, a touch panel may be further disposed between the display panel and the light path control member.

It is illustrated in the drawings that the light path control member is disposed at an upper portion of the display panel, but the embodiment is not limited thereto, and the light path control member may be disposed at various positions such as a position in which light is adjustable, that is, a lower portion of the display panel, or between a second substrate and a first substrate of the display panel, or the like.

In addition, it is shown in the drawings that the light conversion part of the light path control member according to the embodiment is in a direction parallel or perpendicular to an outer surface of the second substrate, but the light conversion part is formed to be inclined at a predetermined angle from the outer surface of the second substrate. Through this, a moire phenomenon occurring between the display panel and the light path control member may be reduced.

Figure 29:
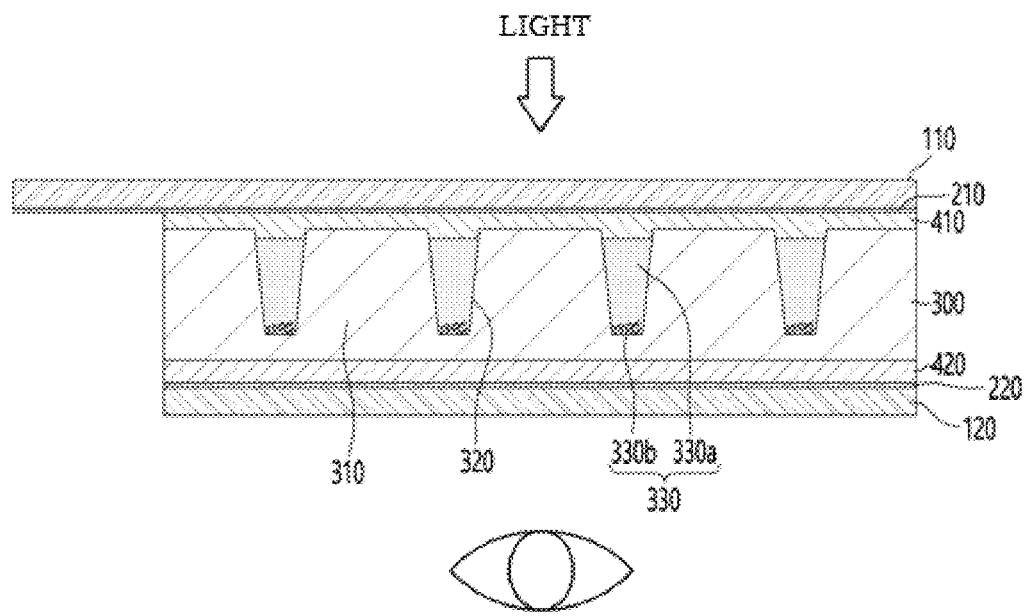
FIGS. 29 to 31 are views for describing one embodiment of the display device to which the light path control member according to the embodiment is applied.
Figure 29:
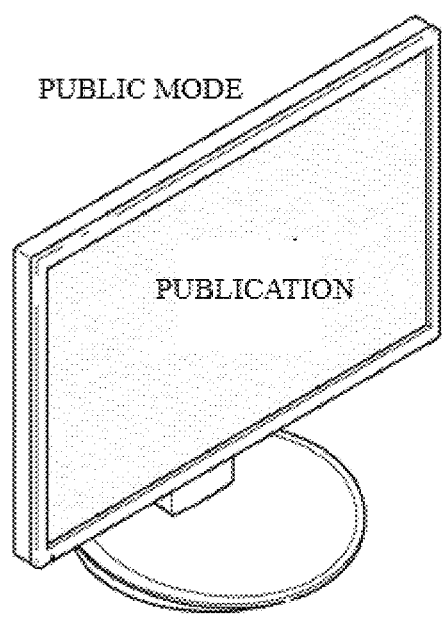
Figure 30:
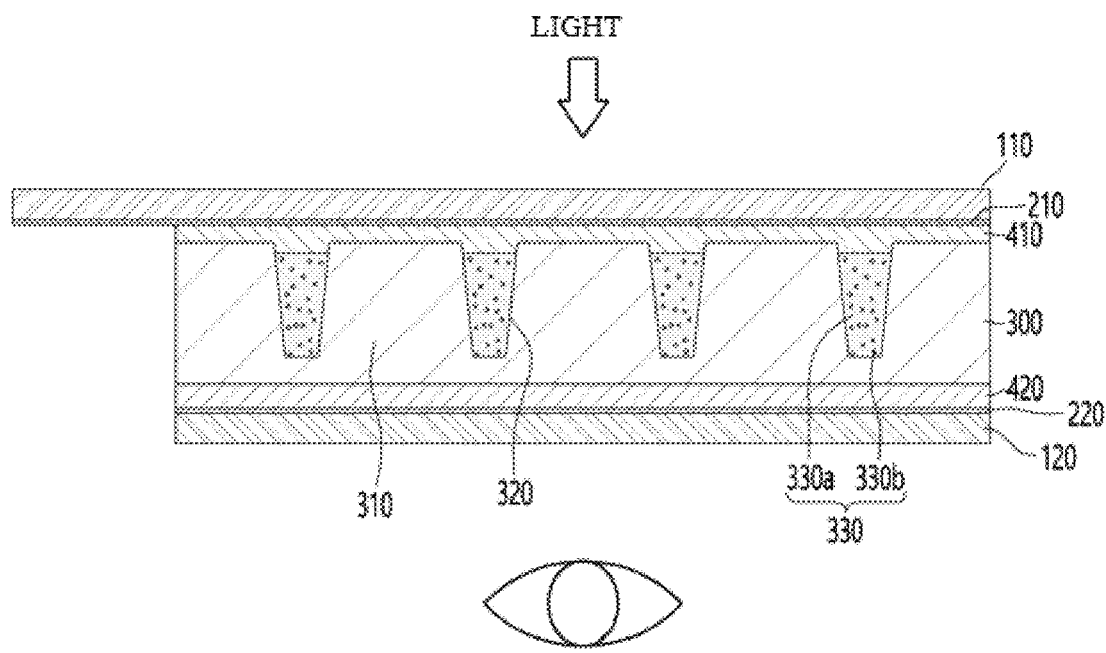
Figure 30:
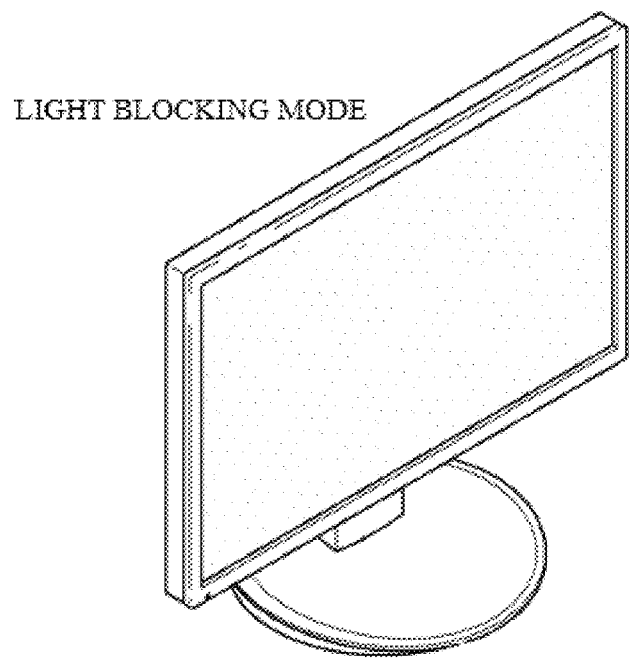
Figure 31:
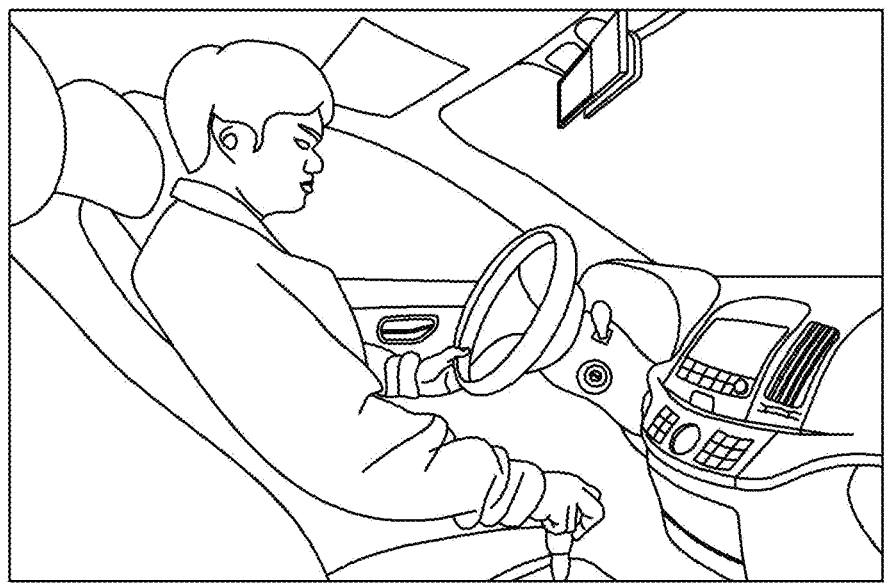

Referring to FIGS. 29 to 31, a light path control member according to an embodiment may be applied to various display devices.

Referring to FIGS. 29 to 31, the light path control member according to the embodiment may be applied to a display device that displays a display.

For example, when power is applied to the light path control member as shown in FIG. 29, the receiving portion functions as the light transmitting part, so that the display device may be driven in the public mode, and when power is not applied to the light path control member as shown in FIG. 30, the receiving portion functions as the light blocking part, so that the display device may be driven in the light blocking mode.

Accordingly, a user may easily drive the display device in a privacy mode or a normal mode according to application of power.

Light emitted from the backlight unit or the self-luminous element may move from the first substrate toward the second substrate. Alternatively, the light emitted from the backlight unit or the self-luminous element may also move from the second substrate toward the first substrate.

In addition, referring to FIG. 31, the display device to which the light path control member according to the embodiment is applied may also be applied inside a vehicle.

For example, the display device including the light path control member according to the embodiment may display a video confirming information of the vehicle and a movement route of the vehicle. The display device may be disposed between a driver seat and a passenger seat of the vehicle.

In addition, the light path control member according to the embodiment may be applied to a dashboard that displays a speed, an engine, an alarm signal, and the like of the vehicle.

Further, the light path control member according to the embodiment may be applied to a front glass (FG) of the vehicle or right and left window glasses.

The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

In addition, embodiments are mostly described above, but the embodiments are merely examples and do not limit the present invention, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present invention defined in the following claims.

The invention claimed is:

1. A light path control member comprising:
   a first substrate;
   a first electrode disposed on the first substrate;
   a second substrate disposed on the first substrate and including a 1-1 cutting portion and a 1-2 cutting portion each extending along a first direction and spaced apart from each other along a second direction different from the first direction, and a 2-1 cutting, portion and a 2-2 cutting portion each extending along the second direction and spaced apart from each other along the first direction;
   a second electrode disposed under the second substrate;
   a light conversion part disposed between the first electrode and the second electrode; and
   a sealing portion disposed inside the 1-1 cutting portion, the 1-2 cutting portion, the 2-1 cutting portion, and the 2-2 cutting portion,
   wherein the light conversion part includes a plurality of partition wall portions and a plurality of receiving portions alternately disposed,
   wherein an open region is formed between the 1-2 cutting portion and the 2-2 cutting portion,
   wherein the second substrate includes first and second side ends facing each other along the first direction, and third and fourth side ends facing each other along the second direction,
   wherein one end of the 1-2 cutting portion is connected to the first side end, and an other end of the 1-2 cutting portion is spaced apart from the second side end in a direction toward the first side end, and
   wherein the open region corresponds to a spaced region between the other end of the 1-2 cutting portion and the 2-2 cutting portion.

2. The light path control member of claim 1, wherein a light conversion material including a dispersion and a plurality of light conversion particles dispersed in the dispersion is disposed in each receiving portion,
   wherein the dispersion includes a first solvent and a second solvent,
   wherein the first solvent includes a material having a carbon number of 2 to 13,
   wherein the second solvent has a dielectric constant of 5 to 10 F/m,
   wherein the second solvent is included in a 1 wt % to 10 wt % with respect to a total amount of the dispersion, and
   wherein a viscosity of the first solvent is lower than a viscosity of the second solvent.

3. The light path control member of claim 2, wherein a difference in viscosity between the first solvent and the second solvent is 0.5 cP to 29 cP.

4. The light path control member of claim 2, wherein the viscosity of the first solvent is 0.5 cP to 5 cP, and the viscosity of the second solvent is 1 cP to 30 Cp.

5. The light path control member of claim 2, wherein the first solvent includes at least one of Isopar C, Isopar E, Isopar G, Isopar H, Isopar K, and Isopar L.

6. The light path control member of claim 1,
wherein the receiving portion is disposed to be tilted with respect to the second direction, and
wherein the 1-2 cutting portion does not contact the 2-2 cutting portion.

7. A display device comprising:
a panel including at least one of a display panel and a touch panel; and
the light path control member of claim 1, which is disposed on or under the panel.

8. The display device of claim 7, wherein the panel includes a backlight unit and a liquid crystal display panel,
the light path control member is disposed between the backlight unit and the liquid crystal display panel, and
light emitted from the backlight unit moves in a direction of the second substrate from the first substrate.

9. The display device of claim 7, wherein the panel includes an organic light emitting diode panel,
the light path control member is disposed on the organic light emitting diode panel, and
light emitted from the panel moves in a direction of the second substrate from the first substrate.

10. The light path control member of claim 1, wherein a first sealing portion is disposed in the 1-1 cutting portion and the 1-2 cutting portion,
a second sealing portion is disposed in the 2-1 cutting portion and the 2-2 cutting portion, and
at least one of the first sealing portion and the second sealing portion is an outermost surface of the light path control member.

11. The light path control member of claim 1, wherein the first substrate includes a first protrusion,
the second substrate includes a second protrusion,
a first connection region is disposed on the first protrusion, and
a second connection region is disposed on the second protrusion.

12. The light path control member of claim 11, wherein the first electrode is exposed in the first connection region.

13. The light path control member of claim 11, wherein a third cutting portion is formed in the second connection region, and
an electrode connection portion is disposed inside the third cutting portion.

14. The light path control member of claim 13, wherein the electrode connection portion is in contact with a side surface of the second electrode.

15. A light path control member comprising:
a first substrate;
a first electrode disposed on the first substrate;
a second substrate disposed on the first substrate and including a 1-1 cutting portion and a 1-2 cutting portion each extending along a first direction and spaced apart from each other along a second direction different from the first direction, and a 2-1 cutting portion and a 2-2 cutting portion each extending along the second direction and spaced apart from each other along the first direction;
a second electrode disposed under the second substrate;
a light conversion part disposed between the first electrode and the second electrode; and
a sealing portion disposed inside the 1-1 cutting portion, the 1-2 cutting portion, the 2-1 cutting portion, and the 2-2 cutting portion,
wherein the light conversion part includes a plurality of partition wall portions and a plurality of receiving portions alternately disposed,
wherein the 1-1 cutting portion, the 1-2 cutting portion, the 2-1 cutting portion, and the 2-2 cutting portion pass through at least one of the second substrate, the light conversion part, and the second electrode,
wherein an open region is formed between the 1-2 cutting portion and the 2-2 cutting portion,
wherein the second substrate includes first and second side ends facing each other along the first direction, and third and fourth side ends facing each other along the second direction,
wherein one end of the 1-2 cutting portion is connected to the first side end, and an other end of the 1-2 cutting portion is spaced apart from the second side end in a direction toward the first side end, and
wherein the open region corresponds to a spaced region between the other end of the 1-2 cutting portion and the 2-2 cutting portion.

* * * * *